(12) United States Patent
Ohse

(10) Patent No.: US 11,527,634 B2
(45) Date of Patent: Dec. 13, 2022

(54) SILICON CARBIDE SEMICONDUCTOR DEVICE

(71) Applicant: FUJI ELECTRIC CO., LTD., Kawasaki (JP)

(72) Inventor: Naoyuki Ohse, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/234,083

(22) Filed: Apr. 19, 2021

(65) Prior Publication Data

US 2021/0391437 A1     Dec. 16, 2021

(30) Foreign Application Priority Data

Jun. 11, 2020   (JP) .............................. JP2020-101929

(51) Int. Cl.
| | |
|---|---|
| *H01L 29/47* | (2006.01) |
| *H01L 21/04* | (2006.01) |
| *H01L 29/78* | (2006.01) |
| *H01L 29/06* | (2006.01) |
| *H01L 29/16* | (2006.01) |

(Continued)

(52) U.S. Cl.
CPC ............ *H01L 29/47* (2013.01); *H01L 21/046* (2013.01); *H01L 21/0495* (2013.01); *H01L 29/063* (2013.01); *H01L 29/0623* (2013.01); *H01L 29/1608* (2013.01); *H01L 29/6606* (2013.01);

(Continued)

(58) Field of Classification Search
CPC ............... H01L 29/7813; H01L 29/872; H01L 29/0615; H01L 29/0619; H01L 29/0638; H01L 29/417; H01L 29/7397; H01L 21/0485; H01L 29/401; H01L 29/41741; H01L 29/1095; H01L 29/41766; H01L 29/45; H01L 29/0696; H01L 29/66068; H01L 29/47; H01L 21/046;

(Continued)

(56) References Cited

U.S. PATENT DOCUMENTS

2008/0277668 A1   11/2008  Okuno et al.
2017/0194438 A1*   7/2017  Kumagai ............ H01L 29/1095

(Continued)

FOREIGN PATENT DOCUMENTS

JP     2005-276978 A    10/2005
JP     2008-135611 A     6/2008

(Continued)

*Primary Examiner* — Shahed Ahmed
*Assistant Examiner* — Khatib A Rahman
(74) *Attorney, Agent, or Firm* — Rabin & Berdo, P.C.

(57) ABSTRACT

An SBD of a JBS structure has on a front side of a semiconductor substrate, nickel silicide films in ohmic contact with p-type regions and a FLR, and a titanium film forming a Schottky junction with an n⁻-type drift region. A thickness of each of the nickel silicide films is in a range from 300 nm to 700 nm. The nickel silicide films each has a first portion protruding from the front surface of the semiconductor substrate in a direction away from the front surface of the semiconductor substrate, and a second portion protruding in the semiconductor substrate from the front surface of the semiconductor substrate in a depth direction. A thickness of the first portion is equal to a thickness of the second portion. A width of the second portion is wider than a width of the first portion.

9 Claims, 22 Drawing Sheets

(51) Int. Cl.
  *H01L 29/66*    (2006.01)
  *H01L 29/872*   (2006.01)
(52) U.S. Cl.
  CPC ...... *H01L 29/7806* (2013.01); *H01L 29/7813* (2013.01); *H01L 29/872* (2013.01)
(58) Field of Classification Search
  CPC ............ H01L 21/0495; H01L 29/0623; H01L 29/063; H01L 29/1608; H01L 29/6606; H01L 29/7806
  See application file for complete search history.

(56) References Cited

U.S. PATENT DOCUMENTS

| | | | |
|---|---|---|---|
| 2017/0271456 A1* | 9/2017 | Ohse | H01L 29/1095 |
| 2019/0067424 A1 | 2/2019 | Kudou | |
| 2019/0229211 A1* | 7/2019 | Bu | H01L 29/0878 |
| 2020/0258996 A1* | 8/2020 | Ohse | H01L 29/45 |
| 2021/0074863 A1* | 3/2021 | Ohse | H01L 29/0619 |
| 2021/0143255 A1* | 5/2021 | Suto | H01L 29/7803 |
| 2021/0175369 A1* | 6/2021 | Ohse | H01L 29/872 |
| 2021/0305369 A1* | 9/2021 | Nakano | H01L 29/1608 |
| 2022/0013639 A1* | 1/2022 | Tanaka | H01L 29/7806 |
| 2022/0085169 A1* | 3/2022 | Shimizu | H01L 21/046 |

FOREIGN PATENT DOCUMENTS

| | | | |
|---|---|---|---|
| JP | 2008-282972 A | 11/2008 | |
| JP | 2019-041084 A | 3/2019 | |

* cited by examiner

SILICON CARBIDE SEMICONDUCTOR DEVICE

CROSS REFERENCE TO RELATED APPLICATIONS

This application is based upon and claims the benefit of priority of the prior Japanese Patent Application No. 2020-101929, filed on Jun. 11, 2020, the entire contents of which are incorporated herein by reference.

BACKGROUND OF THE INVENTION

1. Field of the Invention

Embodiments of the invention related to a silicon carbide semiconductor device.

2. Description of the Related Art

Further enhancement of characteristics is under study for silicon carbide semiconductor devices having silicon carbide (SiC) as a semiconductor material. For example, in a silicon carbide semiconductor device having MOS gates such as an insulated gate bipolar transistor (IGBT) or a metal oxide semiconductor field effect transistor (MOSFET) including insulated gates having a three-layered structure of a metal, an oxide film, and a semiconductor, containing silicon carbide as a semiconductor material, further reduction of cell pitch beyond the current state is under study.

When the cell pitch is reduced, embeddability of a surface metal electrode deposited on a surface of a semiconductor substrate degrades. The surface metal electrode is embedded in an opening (contact hole) of an interlayer insulating film. As a metal material of the surface metal electrode, generally, a metal containing aluminum (Al), which has high thermal conductivity, is used (for example, aluminum-silicon (Al—Si), aluminum-silicon-copper (Al—Si—Cu), etc.). In a semiconductor device having silicon carbide as a semiconductor material (hereinafter, silicon carbide semiconductor device), between a semiconductor substrate and a surface metal electrode, a nickel silicide film is formed as an ohmic electrode in ohmic contact with the semiconductor substrate.

The following three methods are known for improving embeddability of the surface metal electrode. A first method is a method of reducing an aspect ratio (=depth/with) of the contact hole by reducing a thickness of the interlayer insulating film, the aspect ratio being reduced by an amount that the cell pitch is reduced. A second method, in the formation of the surface metal electrode, employs a reflow-sputtering technique of reflowing (planarizing) a sputtered metal material by a high temperature to deposit the metal material while the metal material flows into the contact hole. A third technique is a method of embedding tungsten (W), which has high embeddability, in the contact hole by a chemical vapor deposition (CVD) technique.

As a method of forming an ohmic electrode in a contact hole having a narrow width, a method has been proposed in which a thermal reaction layer/precursor layer that is formed by a first-stage heat treatment is converted into a thermal reaction layer that becomes an ohmic electrode by a heat treatment at a temperature higher than that of the first-stage heat treatment (for example, refer to Japanese Laid-Open Patent Publication No. 2005-276978). In Japanese Laid-Open Patent Publication No. 2005-276978, a contact area between a metal material film and the semiconductor substrate is converted into a silicide by a two-stage heat treatment and in a contact hole of the interlayer insulating film, a thermal reaction layer that becomes an ohmic electrode is formed by self-alignment in an entire area of the surface of the semiconductor substrate.

FIG. 28 is a cross-sectional view depicting one example of an ohmic electrode formed by self-alignment by a method of manufacturing a conventional silicon carbide semiconductor device. FIG. 28 is FIG. 1 of Japanese Laid-Open Patent Publication No. 2005-276978. In a conventional silicon carbide semiconductor device 200 depicted in FIG. 28, in a contact hole 203a of an interlayer insulating film 203, a thermal reaction layer is provided that forms an ohmic electrode 204, in contact with and electrically connecting a high-concentration impurity region 202 of a surface region of a semiconductor substrate 201 containing silicon carbide and a wiring layer 205 embedded in the contact hole 203a of the interlayer insulating film 203.

The ohmic electrode 204 is formed by self-alignment by the two-stage heat treatment described in Japanese Laid-Open Patent Publication No. 2005-276978, in an entire area of the surface of the semiconductor substrate 201 in the contact hole 203a of the interlayer insulating film 203 by using the interlayer insulating film 203 as a mask. The ohmic electrode 204 is provided in a surface region of the high-concentration impurity region 202 exposed at an entire area of the surface of the semiconductor substrate 201 in the contact hole 203a of the interlayer insulating film 203. A width of the ohmic electrode 204 is equal to a width of the contact hole of the interlayer insulating film.

Further, as a conventional silicon carbide semiconductor device, a MOSFET that includes a nickel silicide film that is an ohmic electrode functioning as a source electrode and in ohmic contact with a silicon carbide region (source region and contact region) in a contact hole of an interlayer insulating film has been disclosed (for example, refer to Japanese Laid-Open Patent Publication No. 2019-041084). Japanese Laid-Open Patent Publication No. 2019-041084 discloses that a width of the ohmic electrode and a width of the contact hole in the interlayer insulating film are equal to one another, and a thickness of the ohmic electrode is in a range from 100 nm to 400 nm.

FIG. 29 is a cross-sectional view depicting an example of a conventional silicon carbide semiconductor device. A conventional silicon carbide semiconductor device 210 depicted in FIG. 29 is vertical MOSFET having a trench gate structure that includes, in a contact hole 220a of an interlayer insulating film 220, an ohmic electrode 221 at a front surface of a semiconductor substrate (semiconductor chip) 224 containing silicon carbide. The ohmic electrode 221 is a nickel silicide ($Ni_xSi_y$, where, x, y are arbitrary integers) film in ohmic contact with the semiconductor substrate 224. The ohmic electrode 221 has a width w202 that is at most equal to a width w201 of the contact hole 220a and substantially uniform in a depth direction.

In forming the ohmic electrode 221, with respect to a metal material of the ohmic electrode 221, there are limitation on a thickness (for example, about 50 nm) of a nickel (Ni) film deposited on a front surface of the semiconductor substrate 224 and a period of a heat treatment (sintering) for converting the nickel film into a silicide. Therefore, in general, a thickness t201 of the ohmic electrode 221 is in a range from about 50 nm to 150 nm. Reference numerals 212, 215, 216, 217, 218, 219, 222, 223 are a $n^-$-type drift region, $n^+$-type source regions, a $p^{++}$-type contact region, gate trenches, gate insulating films, gate electrodes, a barrier metal, and a surface metal electrode (Al—Si film), respectively.

Further, a diode having silicon carbide as a semiconductor material and configured to have a Schottky barrier diode (SBD) formed by a Schottky junction between a silicon carbide portion at the front surface of the semiconductor substrate and the surface metal electrode is typical. Further, an SBD having a junction barrier Schottky (JBS) structure in which a Schottky junction and pn junctions are present at the front surface of the semiconductor substrate is known.

FIG. 30 is a cross-sectional view of another example of a conventional silicon carbide semiconductor device. A conventional silicon carbide semiconductor device 240 depicted in FIG. 30 is an SBD having a JBS structure in which, on a front side of a semiconductor substrate 230, a Schottky junction between an n$^-$-type drift region 242 and a Schottky electrode 251 of a front electrode 254, and pn junctions between p-type regions 243 and the n$^-$-type drift region 242 are present. Between a front surface of the semiconductor substrate 230 and the n$^-$-type drift region 242, the p-type regions 243 are selectively provided and between adjacent p-type regions 243 of the p-type regions 243, the n$^-$-type drift region 242 is exposed at the front surface of the semiconductor substrate 230.

Ohmic electrodes 253 of a lowermost layer of the front electrode 254 on the front surface of the semiconductor substrate 230 are provided on the p-type regions 243. Contact resistance between the p-type regions 243 and the front electrode 254 is reduced by the ohmic contact between the p-type regions 243 and the ohmic electrodes 253, and during surge voltage application, surge current flowing in the semiconductor substrate 230 flows locally to the pn junctions between the p-type regions 243 and the n$^-$-type drift region 242. Therefore, an amount of surge current pulled out to the front electrode 254 (hereinafter, pulled amount) increases. Reference numerals 244 and 252 are an interlayer insulating film and a surface metal electrode (Al—Si film).

SUMMARY OF THE INVENTION

According to an embodiment of the invention, a silicon carbide semiconductor device having an active region and a termination region surrounding a periphery of the active region, includes: a semiconductor substrate containing silicon carbide and having a first main surface and a second main surface opposite to each other; a first-conductivity-type region provided in the semiconductor substrate; a plurality of second-conductivity-type regions selectively provided at the first main surface of the semiconductor substrate in the first-conductivity-type region; and a plurality of nickel silicide films provided at the first main surface of the semiconductor substrate, each of the plurality of nickel silicide films facing and in ohmic contact with a respective one of the plurality of second-conductivity-type regions. Said each of the plurality of nickel silicide films has a first portion protruding from the first main surface of the semiconductor substrate in a direction away from the semiconductor substrate and a second portion protruding in the corresponding one of the plurality of second-conductivity-type regions from the first main surface of the semiconductor substrate in the depth direction. The second portion has a width, in a direction parallel to the first main surface of the semiconductor substrate, that is wider than a width of the first portion in said each of the plurality of nickel silicide film.

Objects, features, and advantages of the present invention are specifically set forth in or will become apparent from the following detailed description of the invention when read in conjunction with the accompanying drawings.

DETAILED DESCRIPTION OF THE INVENTION

Figure 28:
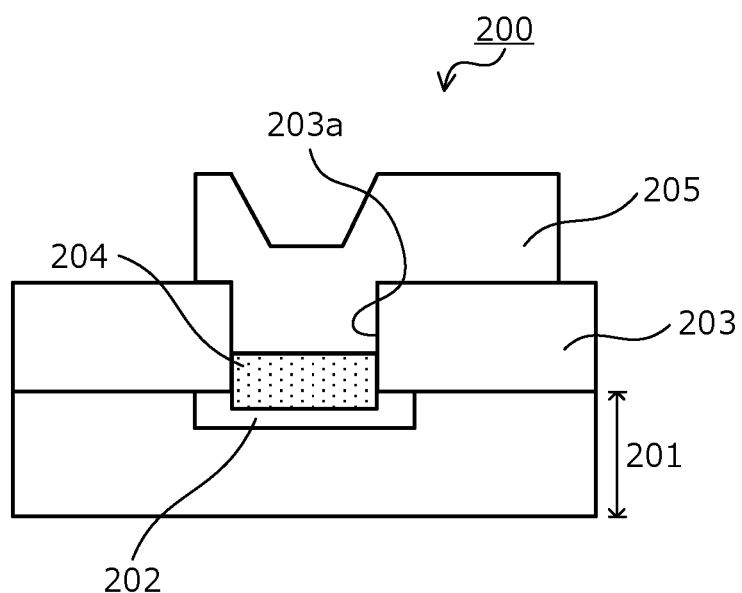
FIG. 28 is a cross-sectional view depicting one example of an ohmic electrode formed by self-alignment by a method of manufacturing a conventional silicon carbide semiconductor device.
Figure 29:
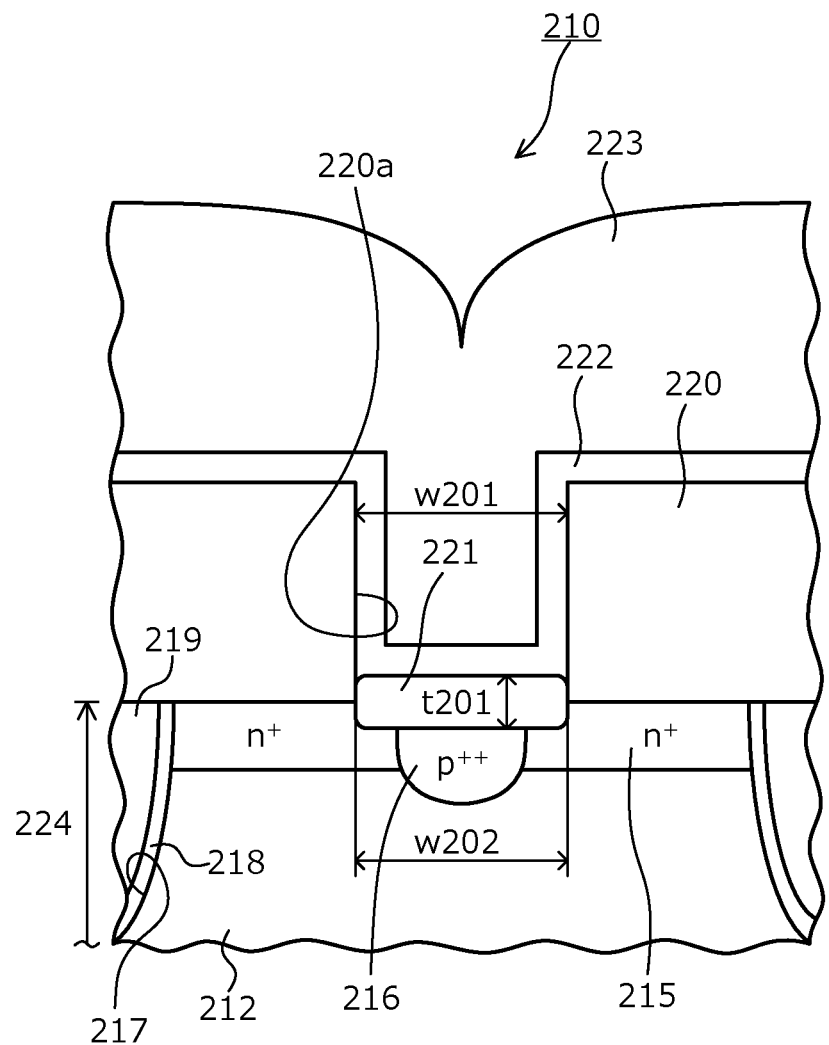
FIG. 29 is a cross-sectional view depicting an example of a conventional silicon carbide semiconductor device.

First, problems associated with the conventional techniques are discussed. In the first method of improving embeddability of the surface metal electrode described above, in an entire area of the front surface of the semiconductor wafer, to form the interlayer insulating film to have at least a predetermined thickness ensuring insulation, the extent to which the thickness of the interlayer insulating film is reduced is limited with consideration of thickness distribution of the interlayer insulating film at the surface of the semiconductor wafer. Further, in the conventional structures (refer to Japanese Laid-Open Patent Publication No. 2005-276978, Japanese Laid-Open Patent Publication No. 2019-041084, FIGS. 28, 29), it is difficult to thickly form the ohmic electrodes so that the aspect ratio of the contact holes of the interlayer insulating film is reduced to an extent that embeddability of the surface metal electrode may be improved.

In the second method of improving the embeddability of the surface metal electrode described above, on the surface of the semiconductor wafer heated to a temperature of at least 400 degrees C., a metal material of the surface metal electrode is sputtered and therefore, an amount of warpage of the semiconductor wafer due to the high-temperature heat treatment increases, whereby in subsequent processes, reliability, etc. during transportation of the semiconductor wafer is difficult to ensure. Further, due to the high-temperature heat treatment, crystallization of the aluminum that is a metal material of the surface metal electrode progresses, whereby unevenness of the aluminum surface increases and thus, flatness of the surface of the surface metal electrode decreases.

In the third method of improving the embeddability of the surface metal electrode described above, while embeddability of the tungsten to the contact holes improves, the cost of tungsten is high and additional equipment and additional processes are necessary, leading to increased cost. The additional processes include a process of depositing in the contact hole, a metal film (for example, a metal stacked film of a Ti film and a TiN film) for enhancing adhesiveness between the silicon carbide region and the tungsten film and thereafter, a process of embedding in the contact hole, a tungsten film on the metal stacked film.

Figure 30:
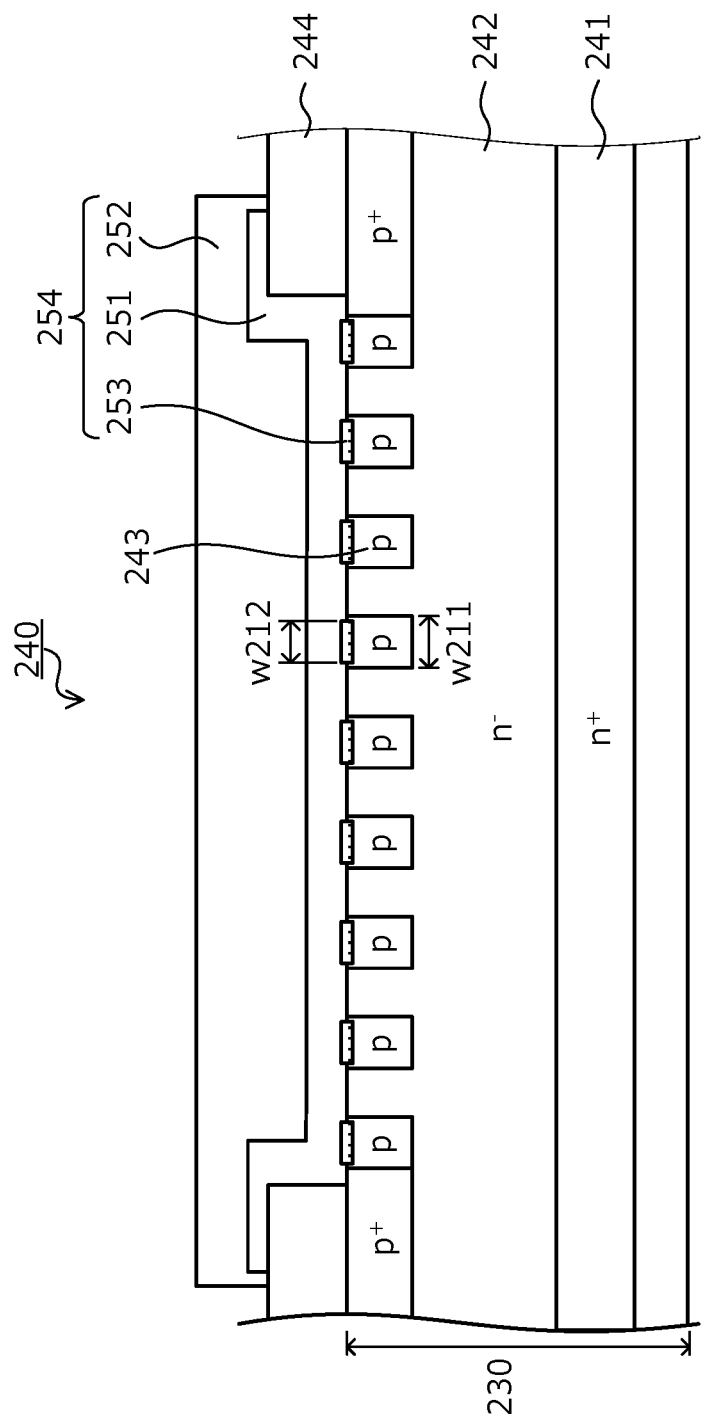
FIG. 30 is a cross-sectional view of another example of a conventional silicon carbide semiconductor device.

Further, in the silicon carbide semiconductor device that is a diode having a JBS structure (refer to FIG. 30), when the contact area between the p-type regions 243 and the ohmic electrodes 253 is increased to reduce the contact resistance between the p-type regions 243 and the ohmic electrodes 253, and the active region is maintained to have the same surface area, the contact area between the n$^-$-type drift region 242 and the Schottky electrode 251 decreases as the contact area between the p-type regions 243 and the ohmic electrodes 253 increases. Therefore, during forward bias, an electron current amount from the n$^-$-type drift region 242 to the Schottky electrode 251 decreases and it becomes difficult to reduce forward voltage (Vf).

While the ohmic electrodes 253 suffice to be formed only on the p-type regions 243 and the Schottky electrode 251 suffices to be formed in an entire area of the surface of the n$^-$-type drift region 242 between adjacent p-type regions 243 of the p-type regions 243, with consideration of a design margin for enhancing alignment accuracy of a mask for forming the ohmic electrodes 253, the ohmic electrodes 253 are formed having a width w212 that is narrower than a width w211 of the p-type regions 243. Therefore, a non-operating region occurs in which the p-type regions 243 and the Schottky electrode 251 are in contact and the contact resistance does not decrease, and sufficient characteristics for increasing the pulled amount of the surge current are not obtained.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
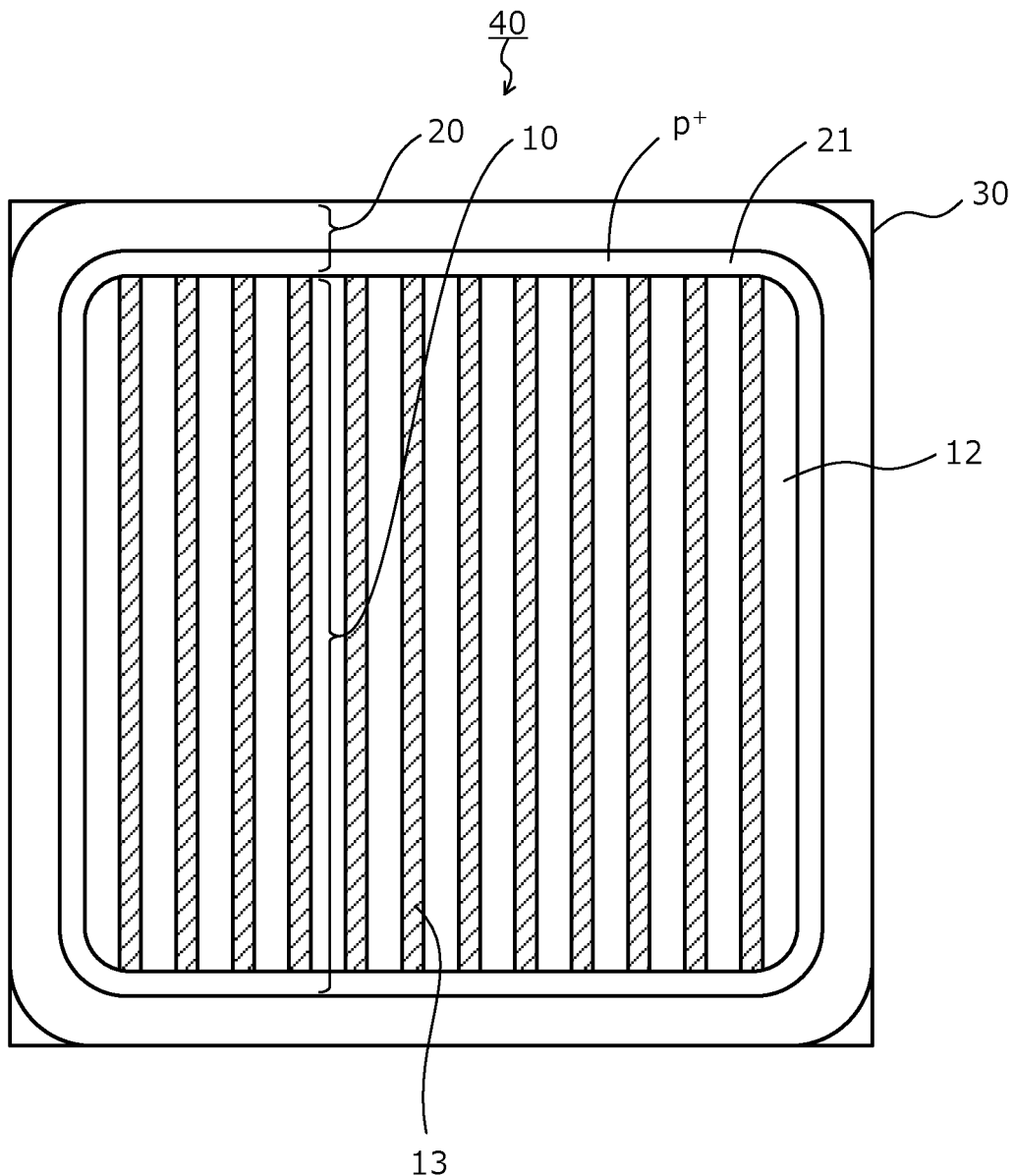
FIG. 1 is a plan view of a layout of a silicon carbide semiconductor device according to a first embodiment when viewed from a front side of a semiconductor substrate thereof.
Figure 2:
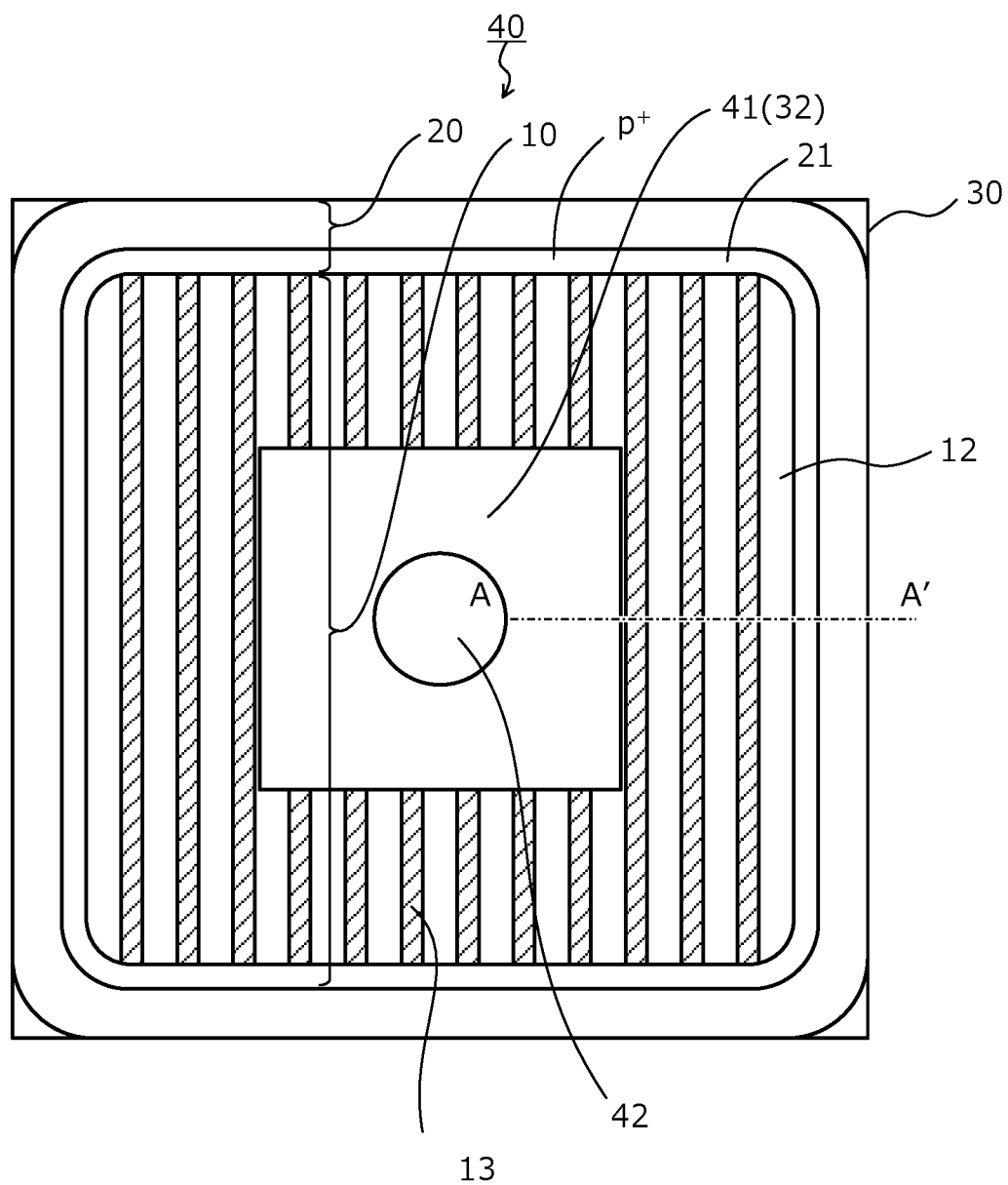
FIG. 2 is a plan view of a layout of the silicon carbide semiconductor device according to the first embodiment when viewed from the front side of the semiconductor substrate thereof.

A structure of a silicon carbide semiconductor device according to a first embodiment is described. FIGS. 1 and 2 are plan views of a layout of the silicon carbide semiconductor device according to the first embodiment when viewed from a front side of a semiconductor substrate thereof. FIG. 1 depicts an example of a layout of p-type regions (second-conductivity-type regions) 13 configuring a JBS structure. FIG. 2 depicts an example of a layout of a bonding pad 41 in portions of a wiring structure on a front surface of a semiconductor substrate (semiconductor chip) 30.

A silicon carbide semiconductor device 40 according to the first embodiment depicted in FIGS. 1 and 2 is a vertical Schottky barrier diode (SBD) having a JBS structure in which, in an active region 10, a Schottky junction between a front electrode 14 (refer to FIG. 3) and a n$^-$-type drift region (first-conductivity-type region) 12, and pn junctions between the p-type regions 13 and the n$^-$-type drift region 12 are present in a semiconductor substrate 30 at a front surface (first main surface) of the semiconductor substrate 30 containing silicon carbide (SiC).

The n$^-$-type drift region 12 and the p-type regions 13 are disposed substantially evenly in a substantially uniform pattern in the semiconductor substrate 30 at the front surface thereof, in the active region 10. The n$^-$-type drift region 12 and the p-type regions 13, for example, are disposed in a striped pattern extending in a same direction parallel to the front surface of the semiconductor substrate 30 and are disposed to be adjacent to and repeatedly alternate with each other in a latitudinal direction orthogonal to a longitudinal direction in which the striped pattern extends. The n$^-$-type drift region 12 is in contact with the front electrode 14, between adjacent p-type regions 13 of the p-type regions 1.

The active region 10 is a region through which current flows when a diode is in an ON state and is a portion closer to a center (a center of the semiconductor substrate 30: chip center) than is a later-described FLR (second-conductivity-type high-concentration region) 21. The active region 10, for example, has a substantially rectangular shape in a plan view thereof and is disposed in substantially the center of the semiconductor substrate 30. An edge termination region 20 is a region between the active region 10 and an end of the semiconductor substrate 30, surrounds a periphery of the active region 10, mitigates electric field of a front side of the semiconductor substrate 30, and sustains breakdown voltage. The breakdown voltage is a voltage limit at which no erroneous operation or destruction of a device element occurs.

Figure 3:
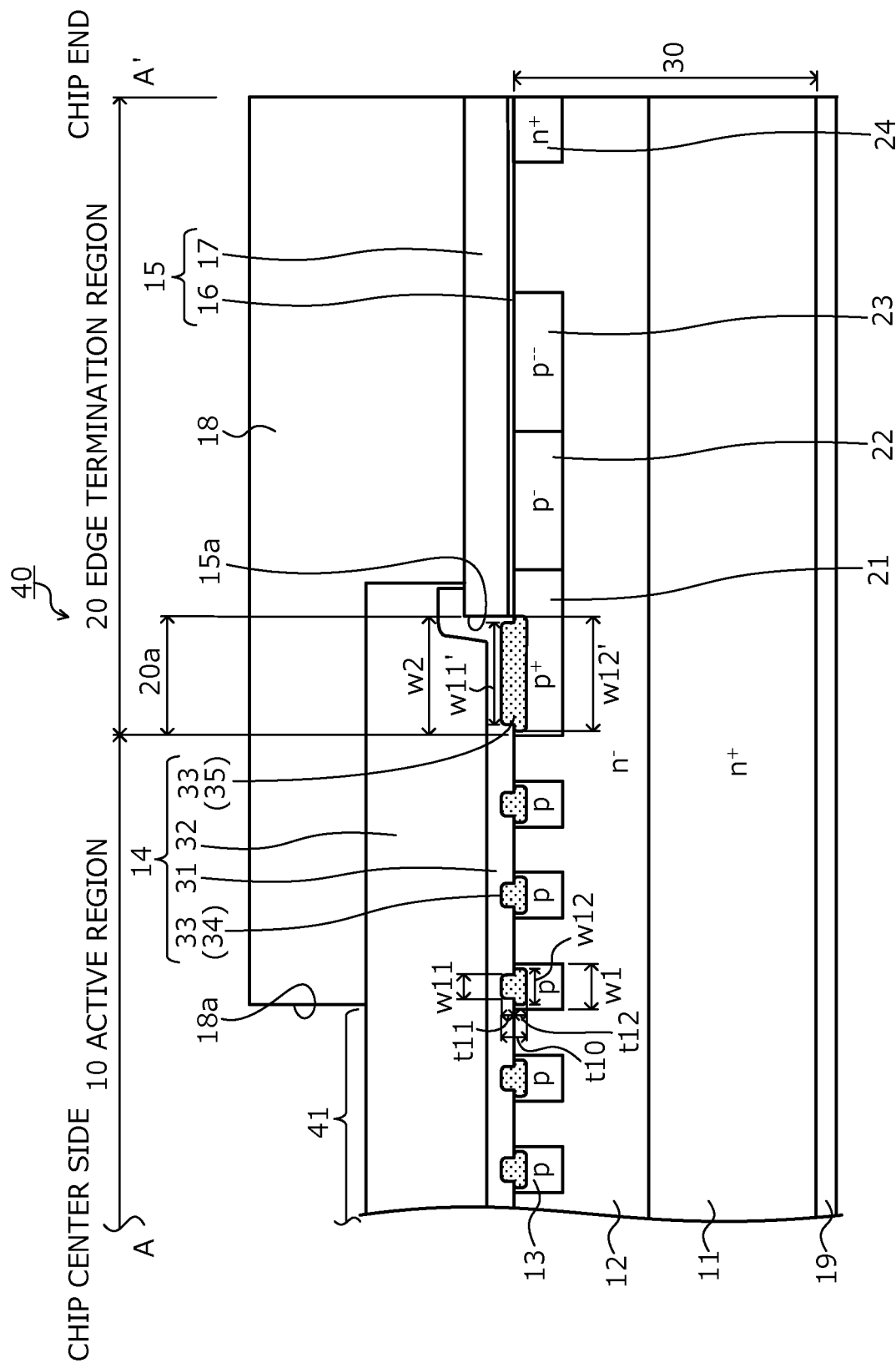
FIG. 3 is a cross-sectional view of a structure along cutting line A-A' in FIG. 2.

In the edge termination region 20, a withstanding voltage structure such as a junction termination extension (JTE) structure is disposed (refer to FIG. 3). The JTE structure is a withstanding voltage structure in which multiple p-type regions (reference numerals 22, 23 in FIG. 3) of differing impurity concentrations are disposed in substantially rectangular concentric shapes surrounding a periphery of the active region 10 and centered around a center of the active region 10 in a plan view thereof, so that the p-type regions are arranged in descending order of impurity concentration in an outward direction toward an end (end of the semiconductor substrate 30) from the center.

In a connecting region 20a (refer to FIG. 3) of the edge termination region 20, a merged PiN Schottky (MPS) structure formed by the field limiting ring (FLR) 21 is disposed. The FLR 21 is a p$^+$-type region surrounding a periphery of the active region 10 in a substantially rectangular shape in a plan view thereof and is in contact with a later-described p$^-$-type region 22 (refer to FIG. 3) that extends outwardly toward the end of the semiconductor substrate 30, from the connecting region 20a of the edge termination region 20. The FLR 21 may be in contact with the p-type regions 13 in a longitudinal direction in which the p-type regions 13 extend in a striped pattern.

The connecting region 20a of the edge termination region 20 is a region between the active region 10 and a later described field oxide film, surrounds a periphery of the active region 10, and connects the active region 10 and a withstanding voltage structure portion of the edge termination region 20. The withstanding voltage structure portion of the edge termination region 20 is portion of the edge termination region 20, from an inner peripheral end portion of the later-described field oxide film 15 to the end of the semiconductor substrate (chip end) and has disposed therein a predetermined withstanding voltage structure such as the JTE structure, an n$^+$-type channel stopper region 24 (refer to FIG. 3), etc.

The front electrode 14 is provided on the front surface of the semiconductor substrate 30, in the active region 10. The front electrode 14 is in contact with and connected electrically to the n$^-$-type drift region 12 and the p-type regions 13. On the front surface of the semiconductor substrate 30, a passivation film 18 (refer to FIG. 3) is provided. The passivation film 18 functions as a protective film that protects the front electrode 14 and a device element structure of the front side of the semiconductor substrate 30.

In the passivation film 18, an opening 18a that exposes a portion of the front electrode 14 is provided. The portion of the front electrode 14 exposed in the opening 18a of the passivation film 18 functions as the bonding pad 41. The bonding pad 41, for example, is disposed in the center of the semiconductor substrate 30. A non-depicted aluminum (Al) wire that is a most general wiring connection in an instance in which current is supplied to the bonding pad 41 is bonded (joined) to the bonding pad 41.

In FIG. 2, a joint portion 42 between the bonding pad 41 and the aluminum wire (not depicted) is depicted having a round shape in a plan view thereof. While the bonding pad 41 may be preferably disposed in the center of the semiconductor substrate 30, as described above, the n$^-$-type drift region 12 and the p-type regions 13 are disposed substantially evenly in a substantially uniform pattern at a surface of the active region 10 and therefore, even when the bonding pad 41 is not disposed in the center of the semiconductor substrate 30, electrical characteristics are not affected. Therefore, degrees of freedom of the wire bonding are high.

Figure 4:
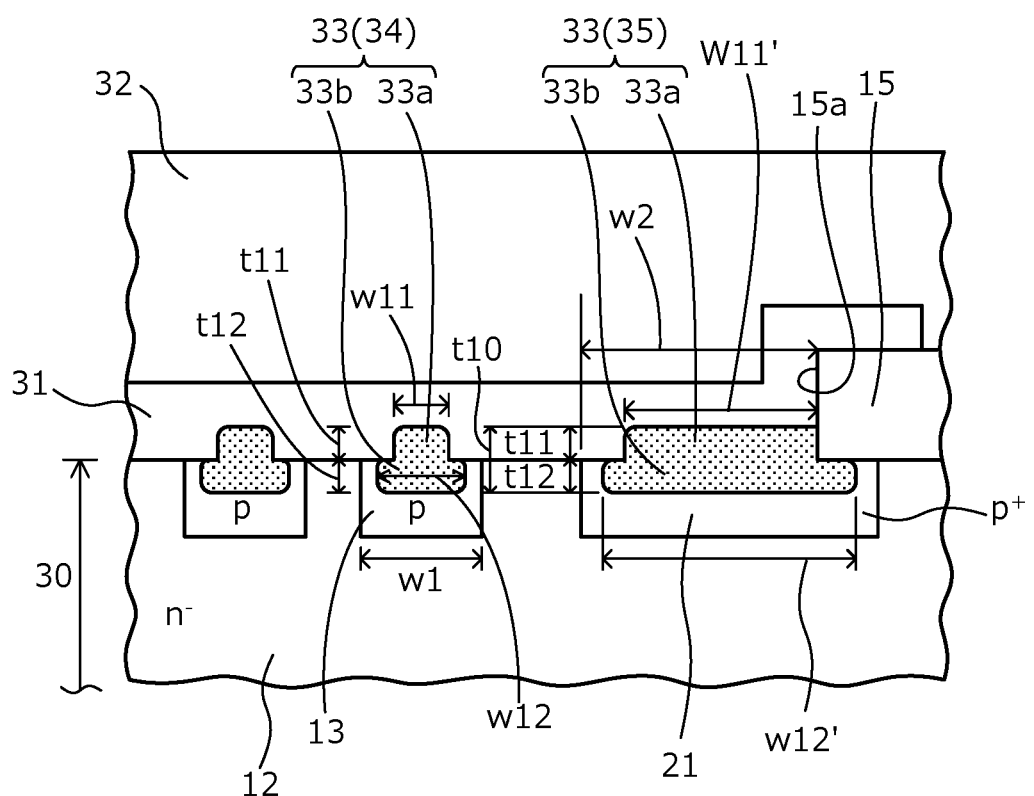
FIG. 4 is an enlarged view of a portion of the cross-sectional view in FIG. 3.

Next, a cross-section of the structure of the silicon carbide semiconductor device 40 according to the first embodiment is described. FIG. 3 is a cross-sectional view of the structure along cutting line A-A' in FIG. 2. FIG. 4 is an enlarged view of a portion of the cross-sectional view in FIG. 3. FIG. 4 depicts an enlarged view of a portion near a border between the active region 10 and the edge termination region 20 in FIG. 3. As described above, the silicon carbide semiconductor device 40 according to the first embodiment includes the JBS structure and the SBD structure of a diode in the active region 10 of the semiconductor substrate 30 containing silicon carbide, and includes the JTE structure as a withstanding voltage structure in the edge termination region 20. The withstanding voltage structure of the edge termination region 20 may be a guard ring.

The semiconductor substrate 30 is an epitaxial substrate in which an n$^-$-type epitaxial layer that forms the n$^-$-type drift region 12 is stacked on a front surface of an n$^+$-type starting substrate 11 containing silicon carbide. The n$^+$-type starting substrate 11 is an n$^+$-type cathode region. Of the semiconductor substrate 30, a main surface that is a surface of the n$^-$-type drift region 12 (surface of the n$^-$-type epitaxial layer that constitutes the n$^-$-type drift region 12) is assumed to be a front surface and a main surface that is a surface of the n$^+$-type starting substrate 11 (back surface of the n$^+$-type starting substrate 11) is assumed to be a back surface (second main surface).

In the active region 10, between the front surface of the semiconductor substrate 30 and the n$^-$-type drift region 12, at least one of the p-type regions 13 configuring the JBS structure is selectively provided. The p-type regions 13 are exposed at the front surface of the semiconductor substrate 30 and are in contact with the n$^-$-type drift region 12. In the active region 10 and the connecting region 20a of the edge termination region 20, exposure at the front surface of the semiconductor substrate 30 means being in contact with the front electrode 14, at the front surface of the semiconductor substrate 30.

In the edge termination region 20, between the front surface of the semiconductor substrate 30 and the n$^-$-type drift region 12, the FLR 21, at least one p-type region (herein, two including the p$^-$-type region 22 and a p$^{--}$-type region 23) configuring the JTE structure, and the n$^+$-type channel stopper region 24 are each selectively provided. The FLR 21 is provided in an entire area of the connecting region 20a of the edge termination region 20, extends outwardly toward the end of the semiconductor substrate 30 from the connecting region 20a, and is in contact with the p⁻-type region 22.

The p⁻-type region 22 is provided closer to the end of the semiconductor substrate 30 than is the FLR 21, the p⁻-type region 22 being separate from the connecting region 20a of the edge termination region 20 and adjacent to the FLR 21. The p⁻⁻⁻-type region 23 is provided adjacent to the p⁻-type region 22 and closer to the end of the semiconductor substrate 30 than is the p⁻-type region 22. The n⁺-type channel stopper region 24 is provided separate from the p⁻⁻⁻-type region 23 and closer to the end of the semiconductor substrate 30 than is the p⁻⁻⁻-type region 23. The n⁺-type channel stopper region 24 is exposed at the end of the semiconductor substrate 30.

The FLR 21, the p⁻-type region 22, the p⁻⁻⁻-type region 23, and the n⁺-type channel stopper region 24 are exposed at the front surface of the semiconductor substrate 30, in contact with the n⁻-type drift region 12. Exposure at the end of the semiconductor substrate 30 means extending to the end of the semiconductor substrate 30. In a portion of the edge termination region 20 other than the connecting region 20a, exposure at the front surface of the semiconductor substrate 30 means being in contact with the field oxide film 15, at the front surface of the semiconductor substrate 30.

The front surface of the semiconductor substrate 30 is covered by the field oxide film 15. The field oxide film 15, for example, may be a stacked film in which a thermal oxide film 16 and a deposited oxide film 17 are sequentially stacked. The thermal oxide film 16 has a function of enhancing adhesiveness between the semiconductor substrate 30 and the field oxide film 15. The field oxide film 15 includes the deposited oxide film 17, whereby the field oxide film 15 may be formed in a shorter period as compared to an instance in which the field oxide film 15 is formed entirely by the thermal oxide film 16.

A contact hole 15a is provided penetrating through the field oxide film 15 in the depth direction. In the contact hole 15a, an entire area of the front surface of the semiconductor substrate 30 in the active region 10 is exposed. Further, the contact hole 15a is formed spanning an inner peripheral portion (the connecting region 20a) of the edge termination region 20, from the active region 10. In the contact hole 15a, the front surface of the semiconductor substrate 30 in the connecting region 20a of the edge termination region 20 is also exposed.

In the contact hole 15a, the n⁻-type drift region 12 and the p-type regions 13 in the active region 10 and an inner peripheral portion of the FLR 21 are exposed. In the contact hole 15a, in an entire area of the front surface of the semiconductor substrate 30, the front electrode 14 is provided. The front electrode 14 functions as an anode electrode. The front electrode 14 is provided along the front surface of the semiconductor substrate 30 in the contact hole 15a and extends on the field oxide film 15.

The front electrode 14 has a stacked structure in which a titanium film (first metal electrode film) 31 and an aluminum alloy film (metal electrode film containing aluminum) 32 are sequentially stacked. The front electrode 14 additionally has lowermost-layer nickel silicide (NiSi, Ni₂Si, or thermally stable NiSi₂) films 33 selectively provided between the front surface of the semiconductor substrate 30 and the titanium film 31. The nickel silicide films 33 have a function of enhancing surge current capability by increasing the current amount (pulled amount) of surge current pulled from inside the semiconductor substrate 30 out to the front electrode 14, the surge current being generated in the semiconductor substrate 30 and flowing in a forward direction when surge voltage is applied.

The nickel silicide films 33, as described hereinafter, are regions that contain nickel, formed by causing the semiconductor substrate 30 and a nickel (Ni) film that forms a metal material film 52 (refer to FIG. 11) deposited on the front surface of the semiconductor substrate 30 to react with each other by a heat treatment. The nickel silicide films 33 may contain unreacted silicon carbide or carbon (for example, later-described excess carbon). Therefore, the nickel silicide films 33 protrude from the front surface of the semiconductor substrate 30 in a direction away from the front surface of the semiconductor substrate 30 by at most the thickness of the metal material film 52 and in the depth direction, protrudes inside the semiconductor substrate 30 from the front surface of the semiconductor substrate 30. Further, a border between the nickel silicide films 33 and the semiconductor substrate 30 has a curved shape formed by only slopes of protrusions on a back side, and the nickel silicide films 33 are exposed at the surface of a portion of the semiconductor substrate 30 adjacent to the contact hole 15a.

The nickel silicide films 33, with the front surface of the semiconductor substrate 30 as a border, each has a portion (hereinafter, first portion) 33a that protrudes from the front surface of the semiconductor substrate 30 in a direction away from the front surface of the semiconductor substrate 30, and a portion (hereinafter, second portion) 33b that protrudes into the semiconductor substrate 30 from the front surface of the semiconductor substrate 30 in the depth direction. A thickness t11 of the first portion 33a of each of the nickel silicide films 33 is substantially equal to a thickness t12 of the second portion 33b thereof. Here, the front surface of the semiconductor substrate 30 is an interface between the titanium film 31 and the n⁻-type drift region 12. The direction away from the front surface of the semiconductor substrate 30 is a direction opposite to the depth direction.

The thickness t11 of the first portion 33a of each of the nickel silicide films 33 is substantially equal in an entire area of the first portion 33a. A thickness t10 (=t11+t12) of each of the nickel silicide films 33, for example, is in a range from about 300 nm to 700 nm, and may be preferably in a range from about 400 nm to 600 nm. The greater the thickness t10 of each of the nickel silicide films 33 is increased, the greater the thicknesses t11, t12 of the first and the second portions 33a, 33b of each of the nickel silicide films 33 may be increased and made substantially equal to each other. The thicknesses being substantially equal to each other means a same thickness within a range that includes an allowable error due to manufacturing process variation.

A width (latitudinal direction width) w11 of the first portion 33a of each of the nickel silicide films 33 is a same as an opening width (latitudinal direction width of openings 51a, 51b, refer to FIG. 11) of a mask (an oxide film 51) used in forming the nickel silicide films 33. A width (latitudinal direction width) w12 of the second portion 33b of each of the nickel silicide films 33 is wider than the width w11 of the first portion 33a of each of the nickel silicide films 33. The width w12 of the second portion 33b of each of the nickel silicide films 33 is wider than the opening width of the mask and by a width wider than the opening width of the mask, an ohmic contact between the nickel silicide films 33 and the semiconductor substrate 30 is formed.

The nickel silicide films 33 may contain aluminum. In this instance, the nickel silicide films 33 are formed by, for example, using a metal stacked film in which a first nickel film, an aluminum film, and a second nickel film are sequentially stacked as the metal material film 52 (refer to FIG. 11) and converting the first and the second nickel films into a silicide. Between the titanium film 31 and the nickel silicide films 33, a compound film of nickel and aluminum (not depicted) may be provided. The nickel silicide films 33 contain aluminum, whereby contact resistance between the nickel silicide films 33 and the p-type regions 13 and between the nickel silicide films 33 and the FLR 21 is reduced.

In particular, the nickel silicide films 33 have first and second nickel silicide films 34, 35 of shapes similar to shapes of the p-type regions 13 and the FLR 21, respectively, in a plan view thereof. The first nickel silicide films 34 are provided between the titanium film 31 and the p-type regions 13 and are ohmic electrodes in ohmic contact with the p-type regions 13. The first nickel silicide films 34 are formed in contact regions between each of the p-type regions 13 and the metal material film 52 deposited on the front surface of the semiconductor substrate 30. The second portions 33b of the first nickel silicide films 34 protrude toward the p-type regions 13 in the depth direction from the front surface of the semiconductor substrate 30 and are in contact with the p-type regions 13, respectively.

The thicker is the thickness t12 of the second portion 33b of each of the first nickel silicide films 34, the deeper from the front surface of the semiconductor substrate 30 a portion where the first nickel silicide films 34 and the p-type regions 13 contact one another may be. As a result, the first nickel silicide films 34 may be caused to be in contact with the p-type regions 13 at portions thereof having a relatively high impurity concentration, formed at positions deeper than the front surface of the semiconductor substrate 30 (depth position of a range of an ion implantation for forming the p-type regions 13), and low resistance ohmic contacts between the first nickel silicide films 34 and the p-type regions 13 may be formed.

Further, the thicker is the thickness t12 of the second portion 33b of each of the first nickel silicide films 34, the deeper from the front surface of the semiconductor substrate 30 the p-type regions 13 may be formed. Therefore, an ion implantation for increasing the impurity concentration of the p-type regions 13 near the front surface of the semiconductor substrate 30 may be omitted, and controllability of the ion implantation for forming the p-type regions 13 increases. As a result, both acceleration energy and dose amount of the ion implantation for forming the p-type regions 13 may be increased and the ion implantation period may be shortened, thereby enabling manufacturing process throughput to be enhanced.

Figure 11:
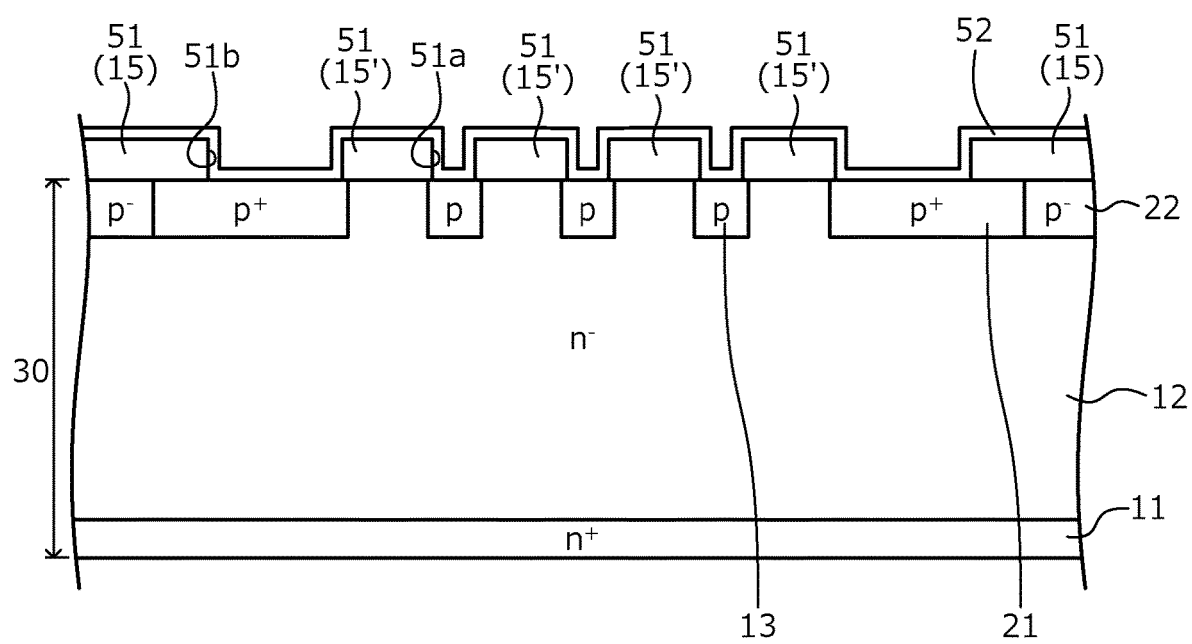
FIG. 11 is a cross-sectional view of a state of the silicon carbide semiconductor device according to the first embodiment during manufacture.

The width w11 of the first portion 33a of each of the first nickel silicide films 34 is a same as an opening width (latitudinal direction width of the openings 51a of the oxide film 51, refer to FIG. 11) of a mask used in forming the first nickel silicide films 34, and is narrower than a width (latitudinal direction width) w1 of each of the p-type regions 13 by a design margin for enhancing alignment accuracy of the mask. In this manner, by taking the design margin for alignment of the mask used in forming the first nickel silicide films 34, the first nickel silicide films 34 may be formed with positioning accuracy at positions facing the p-type regions 13 in the depth direction.

For example, in an instance in which a SiC substate having a c-face is used, the second portion 33b of each of the first nickel silicide films 34 has a portion that is in contact with the contact hole 15a and has a length (=(w12−w11)/2) exposed at the semiconductor substrate 30, shorter than the thickness t12 of the second portion 33b. The width w12 of the second portion 33b of each of the first nickel silicide films 34 may preferably be a measurement that is at most equal to the width w1 of each of the p-type regions 13 and as close as possible to the width w1 of each of the p-type regions 13. The closer the width w12 of the second portion 33b of each of the first nickel silicide films 34 is to the width w1 of each of the p-type regions 13, the wider an ohmic contact area of the first nickel silicide films 34 and the p-type regions 13 may be. Further, the area (surface area) of the p-type regions 13 exposed at the front surface of the semiconductor substrate 30 decreases, and a non-operating region (region that does not contribute to electrical characteristics) where the p-type regions 13 and the titanium film 31 are in contact with each other may be reduced.

The second nickel silicide film 35, in the connecting region 20a of the edge termination region 20, is provided between the FLR 21 and the titanium film 31, and is an ohmic electrode in ohmic contact with the FLR 21. The second nickel silicide film 35 is formed concurrently with the first nickel silicide films 34, in a contact area between the FLR 21 and the metal material film 52 deposited on the front surface of the semiconductor substrate 30 (refer to FIG. 11). The second portion 33b of the second nickel silicide film 35 protrudes toward the FLR 21 in the depth direction from the front surface of the semiconductor substrate 30 and is in contact with the FLR 21.

The thicker is the thickness t12 of the second portion 33b of the second nickel silicide film 35, the deeper from the front surface of the semiconductor substrate 30 a position where the second nickel silicide film 35 and the FLR 21 contact each other may be. As a result, the second nickel silicide film 35 may be caused to be in contact with the FLR 21 at a portion thereof having a relatively high impurity concentration, formed at a position deeper than the front surface of the semiconductor substrate 30 (depth position of a range of an ion implantation for forming the FLR 21), and a low resistance ohmic contact between the second nickel silicide film 35 and the FLR 21 may be formed.

By providing the second nickel silicide film 35, an ohmic electrode having a same function as that of the first nickel silicide films 34 may be disposed in the connecting region 20a of the edge termination region 20. As a result, even in an instance of a small chip size (a planar dimension parallel to the front surface of the semiconductor substrate 30), by a total bonding area of the first and the second nickel silicide films 34, 35 and the semiconductor substrate 30, the ohmic contact area of the front electrode 14 and the semiconductor substrate 30 may be sufficiently established as an amount necessary for obtaining a predetermined surge current capability.

The thicker is the thickness t12 of the second portion 33b of the second nickel silicide film 35, the deeper from the front surface of the semiconductor substrate 30 a portion where the second nickel silicide film 35 and the FLR 21 contact each other may be. As a result, to increase the impurity concentration of the FLR 21 near the front surface of the semiconductor substrate 30, controllability of an ion implantation for forming the FLR 21 increases without a need to control ion implantation conditions. Therefore, both acceleration energy and dose amount of the ion implantation for forming the FLR 21 may be increased and the ion implantation period may be shortened, thereby enabling manufacturing process throughput to be enhanced.

A width w11' of the first portion 33a of the second nickel silicide film 35 is a same as an opening width (latitudinal direction width of the opening 51b of the oxide film 51, refer to FIG. 11) of a mask used in forming the second nickel silicide film 35, and is narrower than a width w2 of the connecting region 20a of the edge termination region 20 by a design margin for enhancing alignment accuracy of the mask. By taking the design margin for alignment of the mask used in forming the second nickel silicide film 35, the second nickel silicide film 35 may be formed with positioning accuracy at a position facing the FLR 21 in the depth direction.

A width of the FLR 21 is wider than the width w1 of each of the p-type regions 13 and therefore, widths w11', w12' of the first and the second portions 33a, 33b of one of the nickel silicide films 33 (the second nickel silicide film 35) in ohmic contact with the FLR 21 are appended with an apostrophe "'". The first portion 33a of the second nickel silicide film 35 is in contact with an inner peripheral side surface (edge) of the field oxide film 15. As a result, the second nickel silicide film 35 may be provided in substantially an entire area of the surface of the FLR 21 in the connecting region 20a of the edge termination region 20 and therefore, the ohmic contact area of the FLR 21 and the second nickel silicide film 35 may be maximized.

The width w12' of a portion of the second portion 33b of the second nickel silicide film 35 (the portion thereof in the connecting region 20a of the edge termination region 20) may preferably be a measurement that is at most equal to the width w2 of the connecting region 20a of the edge termination region 20 and as close as possible to the width w2 of the connecting region 20a of the edge termination region 20. The closer the width w12' of said potion of the second portion 33b of the second nickel silicide film 35 in the connecting region 20a of the edge termination region 20 is to the width w2 of the connecting region 20a of the edge termination region 20, the wider the ohmic contact area of the second nickel silicide film 35 and the FLR 21 may be. Further, the area of a high-resistance Schottky junction between the FLR 21 and the titanium film 31 decreases and therefore, the forward voltage may be reduced.

The second portion 33b of the second nickel silicide film 35 extends closer to the end of the semiconductor substrate 30 than is the inner peripheral side surface of the field oxide film 15, to face and be in contact with a bottom of the field oxide film 15 in the depth direction. As a result, during formation of the second nickel silicide film 35, even when later-described excess carbon precipitates between the second nickel silicide film 35 and the FLR 21, the second nickel silicide film 35 adheres and becomes stuck to the field oxide film 15 more at an uppermost chip surface side than at an interface between the second nickel silicide film 35 and the FLR 21 (anchor effect) and therefore, the second nickel silicide film 35 is resistant to peeling.

The titanium film 31 is provided in an entire area of the front surface of the semiconductor substrate 30 in the contact hole 15a so as to cover all of the nickel silicide films 33 and be in contact with the n$^-$-type drift region 12. A portion of the titanium film 31 bonded to the n$^-$-type drift region 12 is a Schottky electrode formed by a Schottky junction with the n$^-$-type drift region 12. Further, the titanium film 31 is in ohmic contact with the p-type regions 13 and the FLR 21 via the nickel silicide films 33. The titanium film 31 may extend on the field oxide film 15 in an outward direction toward the end of the semiconductor substrate 30 and, for example, may terminate at a position facing the FLR 21 in the depth direction.

The aluminum alloy film 32 covers an entire area of the surface of the titanium film 31, is connected electrically to the titanium film 31, and via the titanium film 31, is electrically connected to the nickel silicide films 33. The aluminum alloy film 32 may extend on the field oxide film 15 in an outward direction to be closer to the end of the semiconductor substrate 30 than is the titanium film 31 and, for example, may terminate at a position facing the p$^-$-type region 22 in the depth direction. The aluminum alloy film 32, for example, is an aluminum silicon (AlSi) film. Instead of the aluminum alloy film 32, an aluminum film may be provided.

A portion of the front surface of the semiconductor substrate 30 other than a portion in contact with the front electrode 14 is covered by the field oxide film 15. On an uppermost surface of the front surface of the semiconductor substrate 30, the passivation film 18 containing a polyimide is provided. On an upper portion of the n$^+$-type channel stopper region 24, a channel stopper electrode (not depicted) in contact with and connected electrically to the n$^+$-type channel stopper region 24 may be provided. The channel stopper electrode, for example, may be an aluminum alloy film formed concurrently with the aluminum alloy film 32.

The passivation film 18 is a protective film that protects the front electrode 14 and the field oxide film 15. In the passivation film 18, the opening 18a that exposes a portion of the aluminum alloy film 32 is provided in the active region 10. A portion of the front electrode 14 exposed in the opening 18a of the passivation film 18 functions as the bonding pad 41. In an entire area of the back surface of the semiconductor substrate 30 (the back surface of the n$^+$-type starting substrate 11), a back electrode (second metal electrode film) 19 is provided and is connected electrically to the n$^+$-type starting substrate 11.

Figure 5:
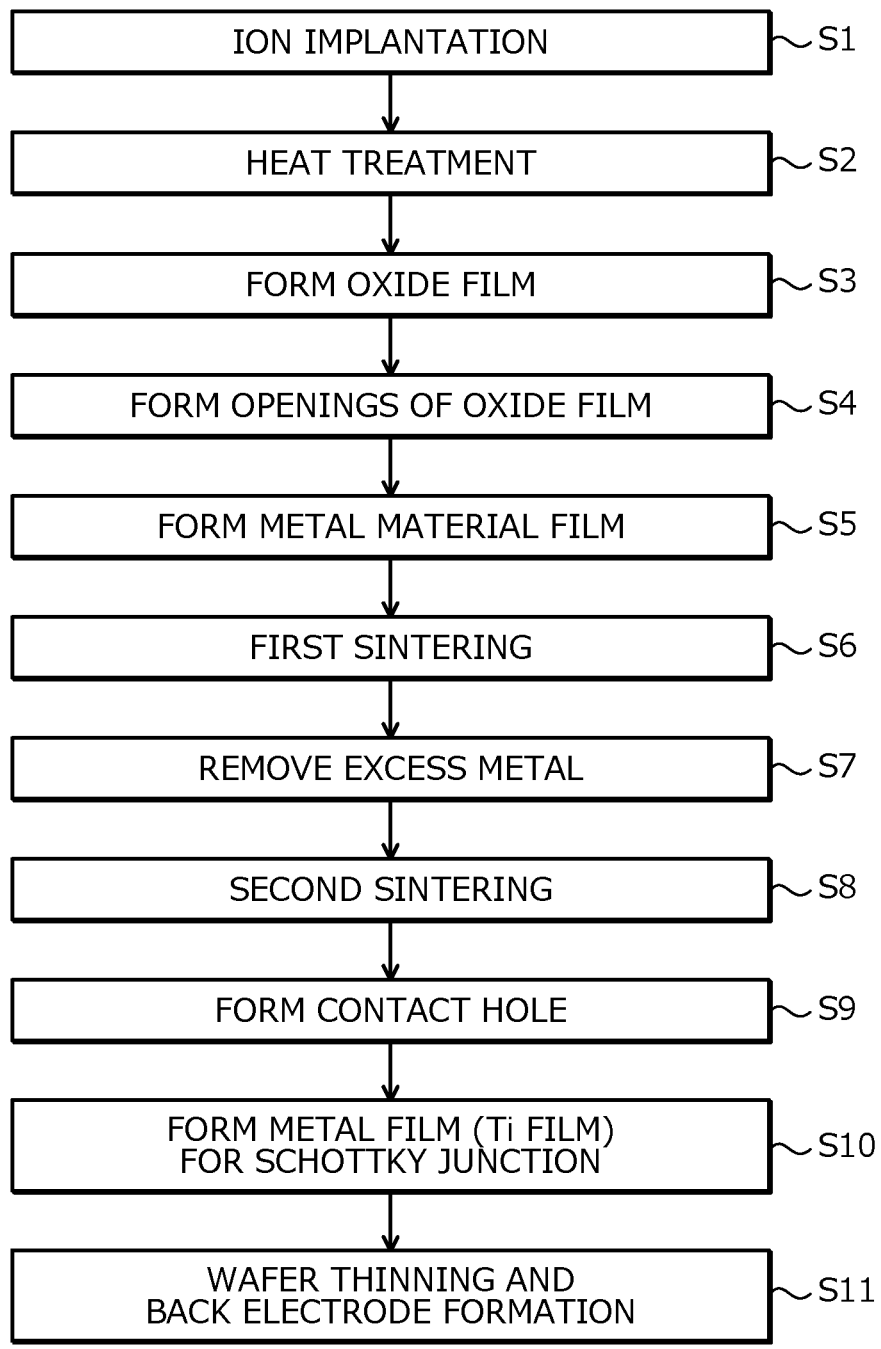
FIG. 5 is a flowchart depicting an outline of a method of manufacturing the silicon carbide semiconductor device according to the first embodiment.

Next, a method of manufacturing the silicon carbide semiconductor device 40 according to the first embodiment is described. FIG. 5 is a flowchart depicting an outline of the method of manufacturing the silicon carbide semiconductor device according to the first embodiment. FIGS. 6, 7, 8, 9, 10, 11, 12, 13, 14, 15, and 16 are cross-sectional views of states of the silicon carbide semiconductor device according to the first embodiment during manufacture. In FIGS. 6 to 16, the active region 10 to the connecting region 20a of the edge termination region 20 is depicted. FIGS. 17, 18, 19, and 20 are enlarged views of portions of FIGS. 11, 13, 14, and 15. In FIGS. 17 to 20, while the states of one of the nickel silicide films 33 during manufacture is depicted, the states depicted in FIGS. 11, 13, 14, and 15 are representative of all of the nickel silicide films 33.

Figure 6:
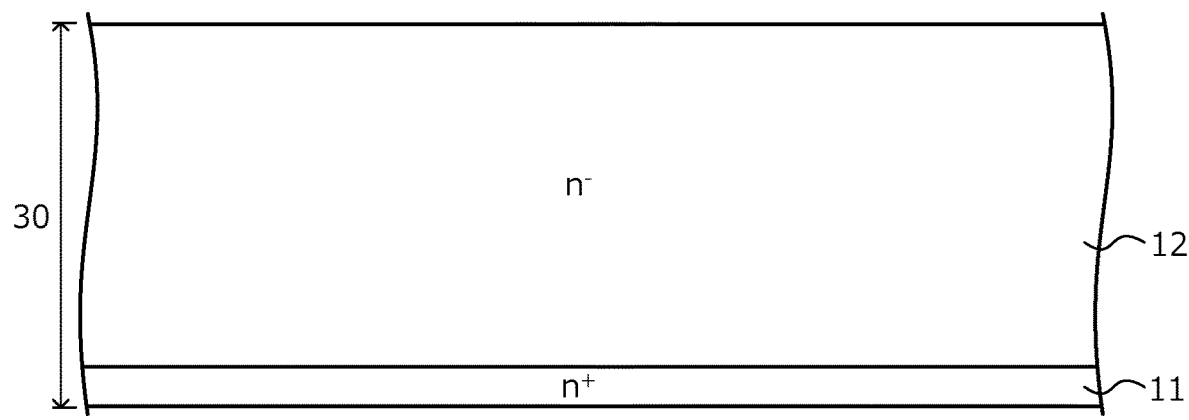
FIG. 6 is a cross-sectional view of a state of the silicon carbide semiconductor device according to the first embodiment during manufacture.

First, as depicted in FIG. 6, as the n$^+$-type starting substrate (semiconductor wafer) 11, for example, a 4-layer periodic hexagonal crystal silicon carbide (4H—SiC) substrate doped with about $1 \times 10^{18}/\text{cm}^3$ of nitrogen (N) is prepared. The front surface of the n$^+$-type starting substrate 11, for example, may have an off-angle of about 4 degrees with respect to a (0001) plane. Next, on the front surface of the n$^+$-type starting substrate 11, for example, an n$^-$-type epitaxial layer doped with about $1.8 \times 10^{16}/\text{cm}^3$ of nitrogen is grown and becomes the n$^-$-type drift region 12.

A thickness of the n$^+$-type starting substrate 11 that becomes the n$^+$-type cathode region, for example, may be about 350 μm. A thickness of the n$^-$-type epitaxial layer that becomes the n$^-$-type drift region 12, for example, may be about 6 μm. By the processes up to here, the semiconductor substrate (semiconductor wafer) 30 in which the n$^-$-type epitaxial layer that becomes the n$^-$-type drift region 12 is stacked on the front surface of the n$^+$-type starting substrate 11 is fabricated. As described above, of the semiconductor substrate 30, the main surface that is a surface of the n$^-$-type drift region 12 is assumed to be the front surface, and the main surface that is a surface of the n⁺-type starting substrate 11 is assumed to be the back surface.

Figure 7:
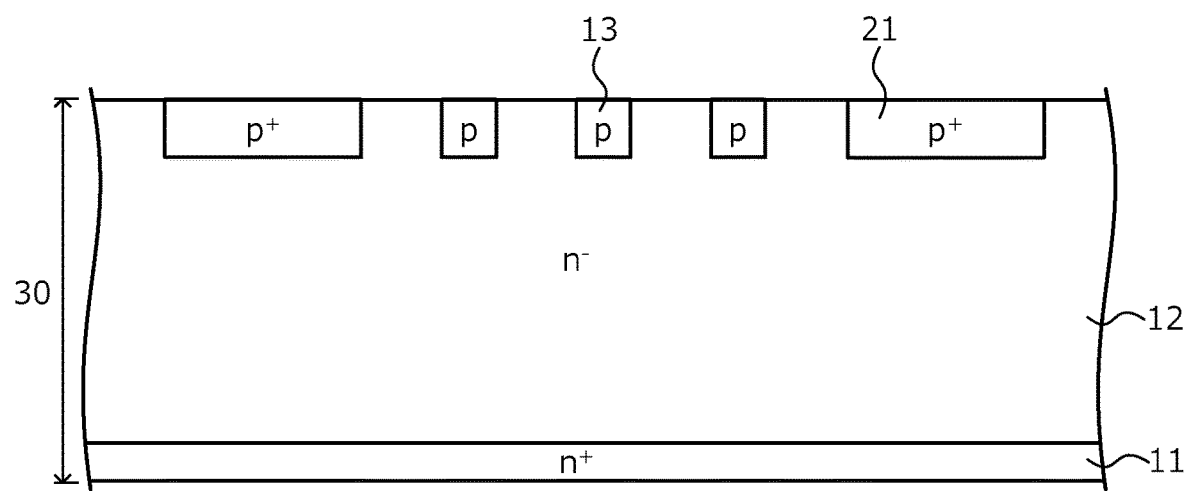
FIG. 7 is a cross-sectional view of a state of the silicon carbide semiconductor device according to the first embodiment during manufacture.

Next, as depicted in FIG. 7, a process including photolithography and a first ion implantation of a p-type impurity such as aluminum as one set is performed repeatedly under different impurity concentration conditions, whereby the FLR 21 and at least one of the p-type regions 13 configuring the JBS structure are each formed selectively in surface regions of the front surface of the semiconductor substrate 30 (step S1 (part 1)). In FIG. 7, the JBS structure is simplified, a fewer number (here, 3) of the p-type regions 13 are depicted as compared to in FIG. 1 (similarly in FIGS. 8 to 16).

In the conventional structure (refer to FIG. 30), the ohmic electrodes 253 are in ohmic contact with the p-type regions 243 at shallow positions in the semiconductor substrate 230 at the front surface thereof. Therefore, the ion implantation for forming the p-type regions 243 is divided into multiple stages of differing acceleration energies so that a box profile is formed from the front surface of the semiconductor substrate 230 to a predetermined depth, a p-type impurity is ion implanted, and the p-type regions 243 are formed, whereby the p-type regions 243 have a high impurity concentration at portions thereof that are shallow from the front surface of the semiconductor substrate 230.

On the other hand, in the first embodiment, the nickel silicide films 33 may be in contact with the p-type regions 13 and the FLR 21, respectively, at deep positions from the front surface of the semiconductor substrate 30 and therefore, the impurity concentrations of the p-type regions 13 and of the FLR 21 at respective portions thereof shallow from the front surface of the semiconductor substrate 30 may be low. Therefore, the first ion implantation may be performed under looser positioning conditions for the impurity implantation depth than the ion implantation for forming the p-type regions 243 of the conventional structure, and the manufacturing process throughput may be enhanced.

Figure 8:
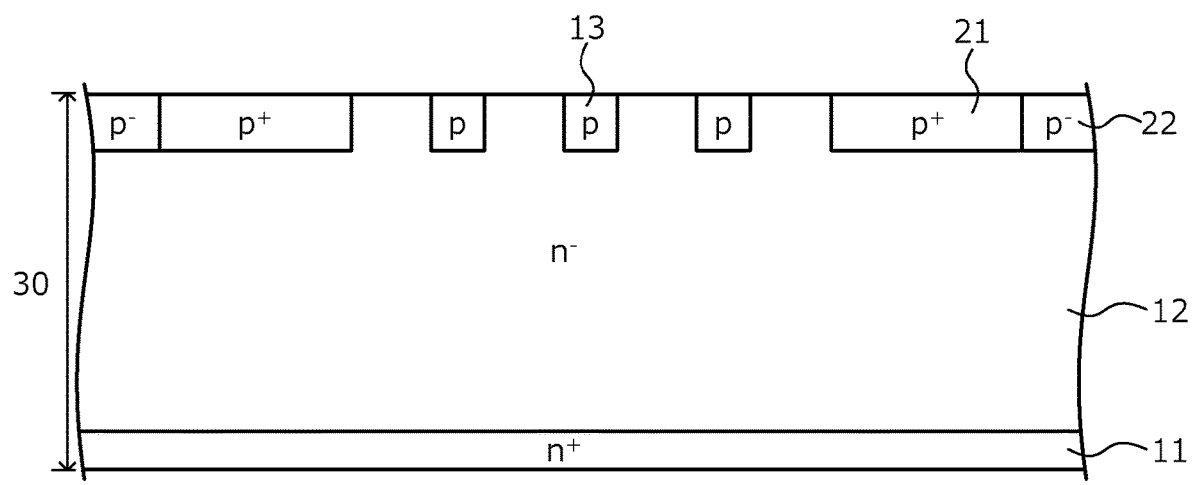
FIG. 8 is a cross-sectional view of a state of the silicon carbide semiconductor device according to the first embodiment during manufacture.

Next, as depicted in FIG. 8, a process including photolithography and a second ion implantation of an impurity as one set is performed under different conditions, whereby in the edge termination region 20 (refer to FIG. 3), p-type regions (the p⁻-type region 22 and the p⁻⁻-type region 23, refer to FIG. 3) configuring the JTE structure, and the n⁺-type channel stopper region 24 (refer to FIG. 3) are each selectively formed in surface regions of the front surface of the semiconductor substrate 30 (step S1 (part 2)). The second ion implantation, for example, is divided into and performed in multiple stages so that the impurity concentration distribution has a box profile.

Figure 9:
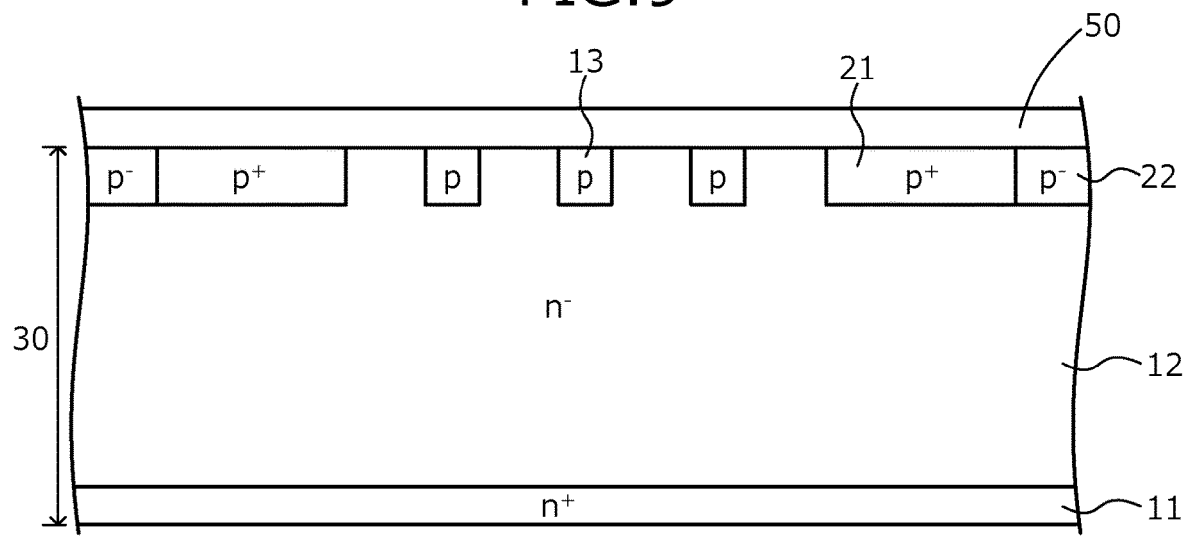
FIG. 9 is a cross-sectional view of a state of the silicon carbide semiconductor device according to the first embodiment during manufacture.
Figure 10:
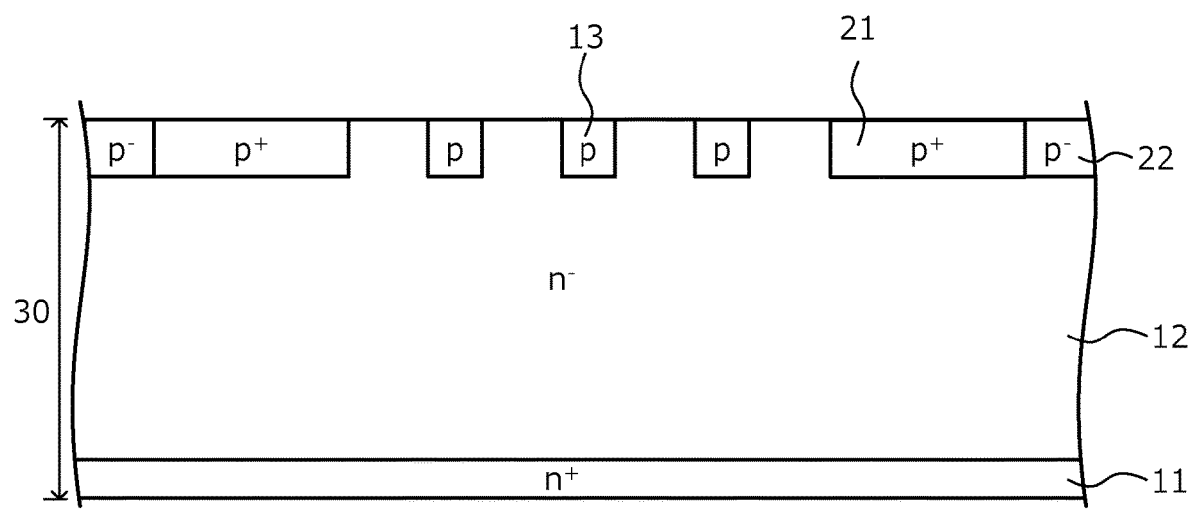
FIG. 10 is a cross-sectional view of a state of the silicon carbide semiconductor device according to the first embodiment during manufacture.

Next, as depicted in FIG. 9, in an entire area of the front surface of the semiconductor substrate 30, for example, a carbon (C) protective film 50 is formed. Further, with an entire area of the front surface of the semiconductor substrate 30 protected by the carbon protective film 50, impurities implanted by the first and the second ion implantation are activated by a heat treatment (step S2). Next, as depicted in FIG. 10, for example, by an ashing process (ashing), the carbon protective film 50 is removed. Next, as depicted in FIG. 11, in an entire area of the front surface of the semiconductor substrate 30, the oxide film 51 that becomes the field oxide film 15 is formed (step S3).

Next, by photolithography and etching, the oxide film 51 is selectively removed, whereby the openings 51a, 51b are formed (step S4). In the process at step S4, the openings 51a that respectively expose the p-type regions 13 and the one opening 51b that exposes the inner peripheral portion of the FLR 21 in a substantially rectangular shape surrounding a periphery of the active region 10 are formed in the oxide film 51. Of the oxide film 51, portions 15' covering the n⁻-type drift region 12 in the active region 10, and a portion that becomes the field oxide film 15 in the edge termination region 20 are left.

The portions left of the oxide film 51 including the portion that becomes the field oxide film 15 all become an oxide mask used in forming the nickel silicide films 33 by a later-described process. Of the oxide film 51, portions 15' covering the n⁻-type drift region 12 in the active region 10 are not left in the product (the silicon carbide semiconductor device 40). In other words, in the process at step S4, the field oxide film 15 and the oxide mask used in formation of the nickel silicide films 33 are formed concurrently. Therefore, the oxide film 51 has a same stacked structure as the field oxide film 15.

The process at step S4 suffices to be performed by dry etching. As a result, sidewalls of the openings 51a, 51b of the oxide film 51 may be made substantially orthogonal to the front surface of the semiconductor substrate 30 and therefore, the p-type regions 13 and the FLR 21 may be exposed with dimensional accuracy. Further, an outer peripheral sidewall of the opening 51b of the oxide film 51 forms a sidewall of the contact hole 15a formed in the field oxide film 15 (the inner peripheral side surface of the field oxide film 15) and therefore, the contact hole 15a of the field oxide film 15 may be formed with dimensional accuracy.

Figure 17:
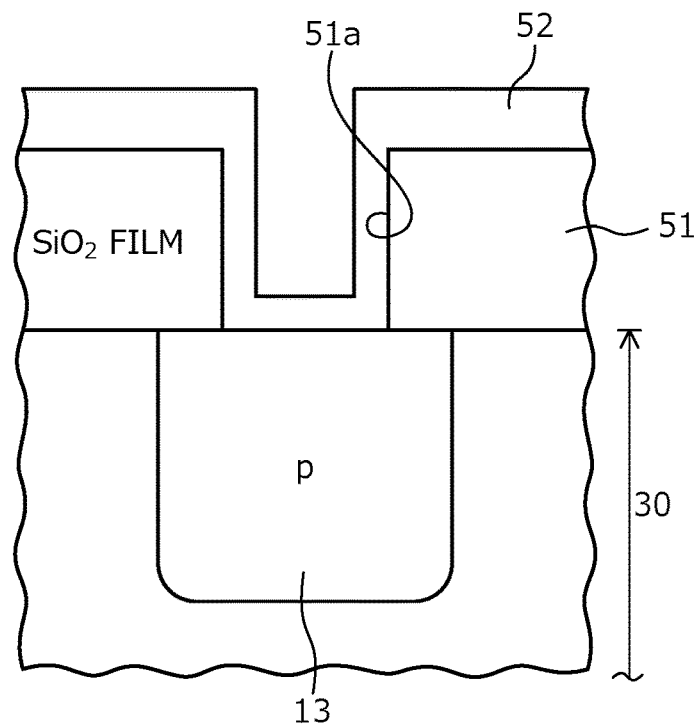
FIG. 17 is an enlarged view of portions of FIG. 11.

Next, for example, by a sputtering method, from the surface of the oxide film 51 and spanning the front surface of the semiconductor substrate 30 in the openings 51a, 51b of the oxide film 51 (surface), the metal material film 52 is formed on said surface (step S5). The metal material film 52, for example, is a single-layer nickel film (FIG. 17). A thickness of the metal material film 52, for example, is in a range from about 150 nm to 350 nm and preferably, may be in a range from about 200 nm to 300 nm. As a result, by later-described first and second heat treatments, the nickel silicide films 33 having the final thickness t10 are formed.

In an instance in which the nickel silicide films 33 containing aluminum are formed, for example, the metal material film 52 is assumed to be a metal stacked film in which the first nickel film, the aluminum film, and the second nickel film are sequentially stacked having thicknesses of a ratio 1:1:1. A total thickness of the first and the second nickel films, for example, is in a range from about 150 nm to 350 nm and preferably, may be in a range from about 200 nm to 300 nm. As a result, due to the later-described first and second heat treatments, the semiconductor substrate 30 and the metal stacked film react with each other, whereby the nickel silicide films 33 containing aluminum are formed having the final thickness t10 (refer to FIGS. 3 and 4).

Further, in the instance in which the nickel silicide films 33 containing aluminum are formed with the metal stacked film in which the first nickel film, the aluminum film, and the second nickel film are sequentially stacked as the metal material film 52, the second nickel film functions as a cap film that prevents condensation of the aluminum film during a heat treatment at later-described step S6. By using the second nickel film as a cap film, the aluminum film may be prevented from becoming partially granulated due to the heat treatment at step S6 and aluminum in the nickel silicide films 33 may be diffused uniformly.

Figure 12:
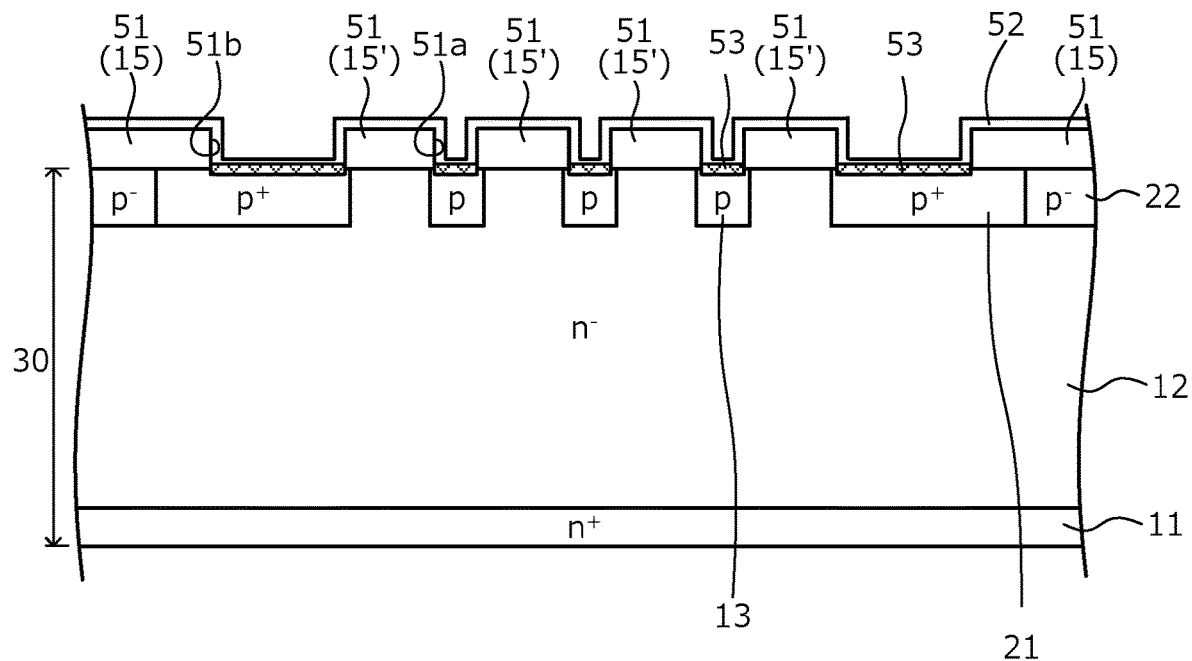
FIG. 12 is a cross-sectional view of a state of the silicon carbide semiconductor device according to the first embodiment during manufacture.

Next, as depicted in FIG. 12, by the first heat treatment, a first sintering of the metal material film 52 is performed, and in a portion where the metal material film 52 and the semiconductor substrate 30 contact each other, nickel atoms in the metal material film 52 and silicon atoms in the semiconductor substrate 30 mutually diffuse thermally (step S6). As a result, in the openings 51a, 51b of the oxide film 51, the metal material film 52 is converted into a silicide, an initial nickel silicide film 53 in ohmic contact with the semiconductor substrate 30 is formed having a thickness t10' (refer to FIG. 18) that is thinner than the final thickness t10 (refer to FIGS. 3 and 4, product thickness).

The first heat treatment is performed under conditions that mutually diffuse the nickel atoms in the metal material film 52 and the silicon atoms in the semiconductor substrate 30 sufficiently. Further, when the temperature of the first heat treatment is too high, the metal material film 52 and the oxide film 51 that is a silicon oxide ($SiO_2$) film react with each other, adversely affecting the portion of the oxide film 51 left as the field oxide film 15. Therefore, the first heat treatment may be performed at a temperature at which the metal material film 52 and the oxide film 51 do not react, for example, about 600 degrees C., for example, for about 5 minutes to 20 minutes, or preferably for about 8 minutes to 10 minutes.

The first heat treatment may be by lamp heating such as rapid thermal annealing (RTA) of directly heating the semiconductor substrate 30 by using an infrared lamp or a lamp heater, or an atmosphere heat treatment of heating the semiconductor substrate 30 by a heated atmosphere. When the first heat treatment is lamp heating, while temperature management of the first heat treatment is easy, the treatment period of the first heat treatment is long and with lamp life being short, is difficult to apply to mass production. Therefore, by setting the first heat treatment to be an atmosphere heat treatment, mass production may be enhanced. Further, by performing the first heat treatment by a vertical furnace capable of collectively treating multiple wafers housed in a wafer cassette (batch treatment), mass production may be enhanced.

The nickel silicide film 53 is generated by portions of the p-type regions 13 and portions of the FLR 21 shallow from the front surface of the semiconductor substrate 30 reacting with the metal material film 52. Therefore, the nickel silicide film 53 is formed by self-alignment using the oxide film 51 so as to bite into the semiconductor substrate 30 (the p-type regions 13 and the FLR 21) in the depth direction in the openings 51a, 51b of the oxide film 51. Therefore, a width (latitudinal direction width) of the nickel silicide film 53 is a same as a latitudinal direction width of the openings 51a, 51b of the oxide film 51.

In the nickel silicide film 53, by a silicide reaction between the semiconductor substrate 30 and the metal material film 52, excess carbon (C) in the semiconductor substrate 30 (hereinafter, excess carbon) may be precipitated to an extent that the excess carbon does not form a layer. The excess carbon is excess carbon atoms in the semiconductor substrate 30 not consumed by the silicon atoms in the semiconductor substrate 30 during the silicide reaction described above. In particular, in the nickel silicide film 53, the excess carbon may be precipitated into granules and distributed.

Figure 13:
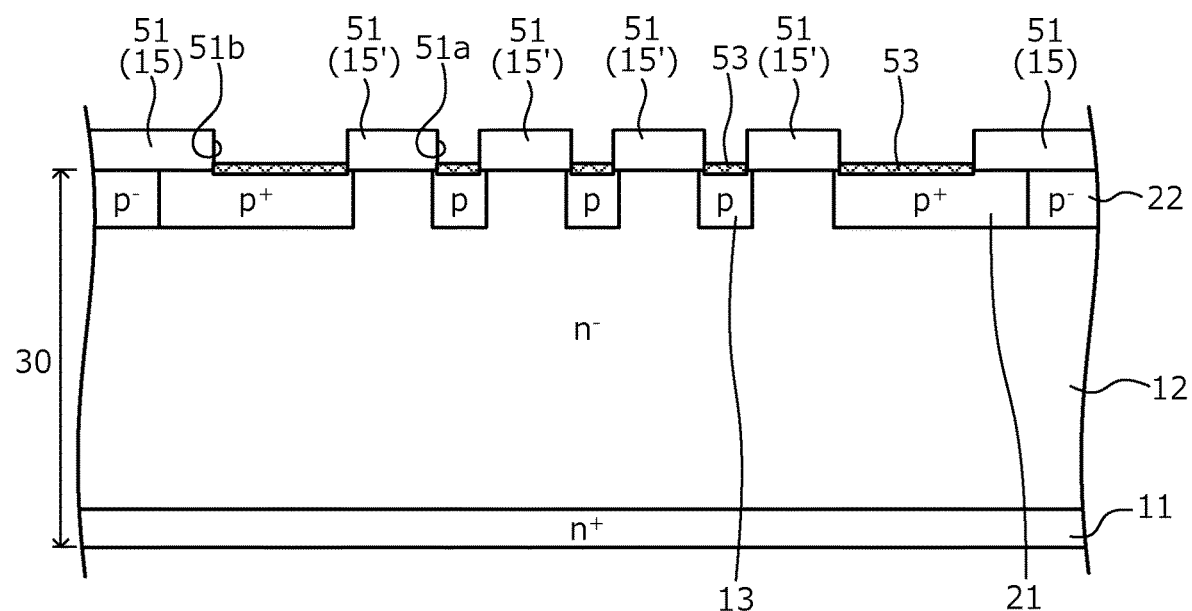
FIG. 13 is a cross-sectional view of a state of the silicon carbide semiconductor device according to the first embodiment during manufacture.
Figure 18:
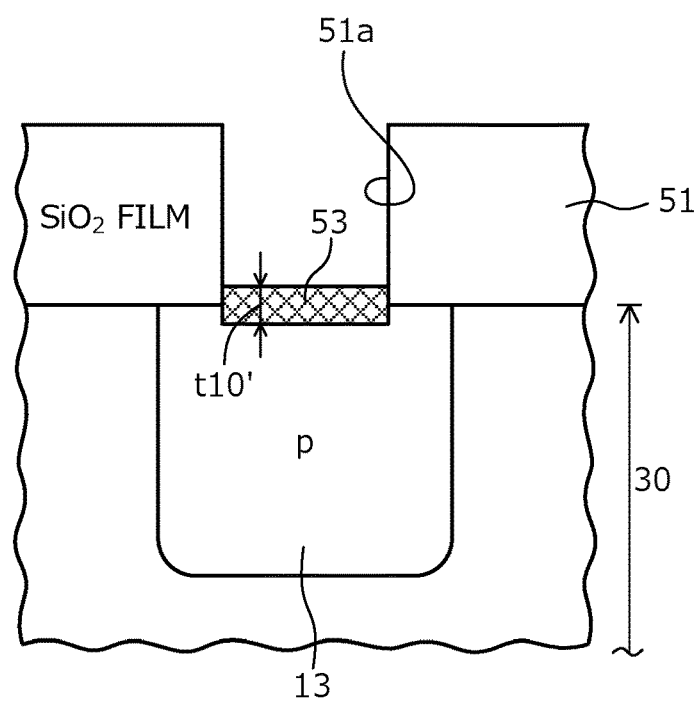
FIG. 18 is an enlarged view of portions of FIG. 13.

Next, as depicted in FIGS. 13 and 18, for example, an entire area of the front surface of the semiconductor substrate 30 is etched by wet etching, whereby excess metal on the oxide film 51 and in the openings 51a, 51b of the oxide film 51 is removed (step S7). The excess metal is a portion of the metal material film 52 other than the portion that becomes the nickel silicide film 53 and in particular, is an unreacted nickel film that did not contribute to the generation of the nickel silicide film 53. By the process at step S7, the nickel silicide film 53 is left in each of the openings 51a, 51b of the oxide film 51.

Figure 14:
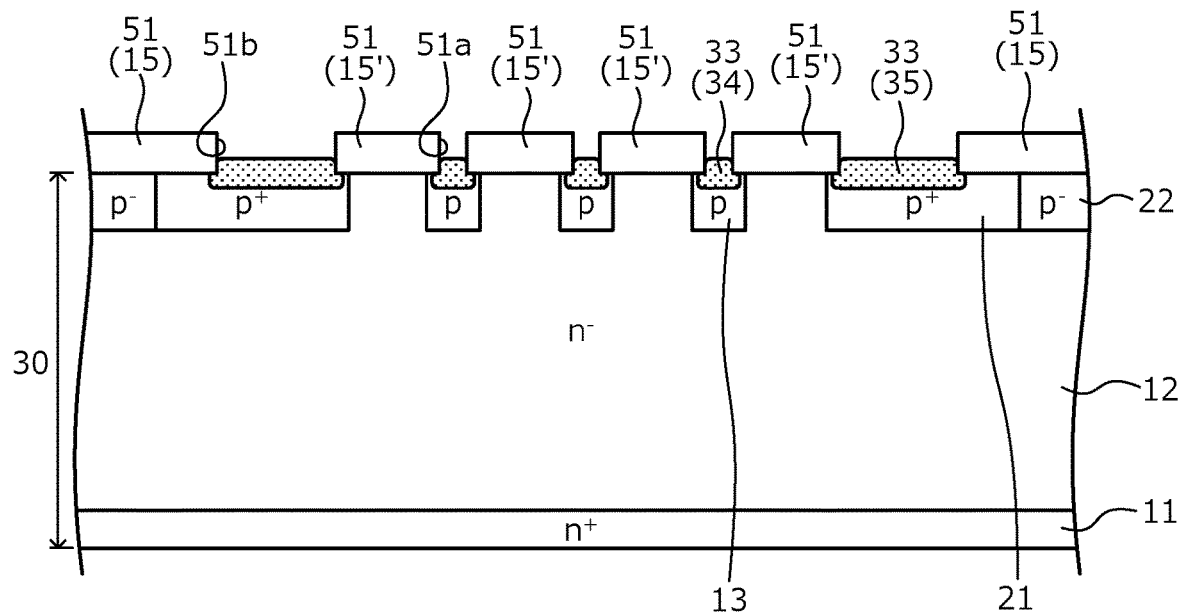
FIG. 14 is a cross-sectional view of a state of the silicon carbide semiconductor device according to the first embodiment during manufacture.
Figure 19:
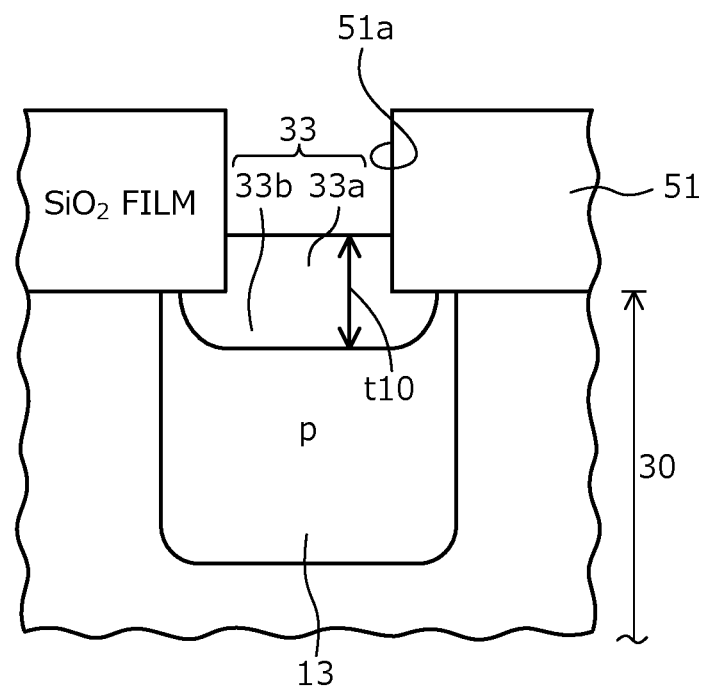
FIG. 19 is an enlarged view of portions of FIG. 14.
Figure 20:
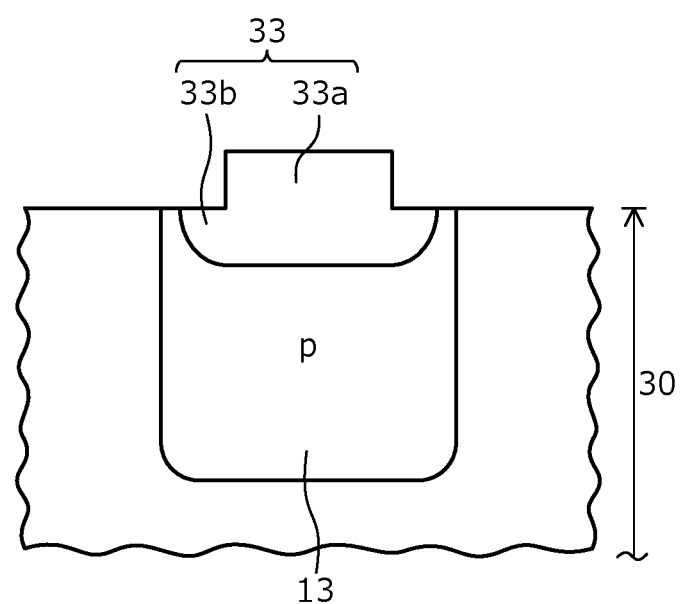
FIG. 20 is an enlarged view of portions of FIG. 15.

Next, as depicted in FIGS. 14 and 19, by the second heat treatment, a second sintering of the nickel silicide film 53 is performed (step S8). By the second heat treatment, conversion of the nickel silicide film 53 into a silicide progresses and the thickness increases, so that the nickel silicide films 33 have the final thickness t10. By the second heat treatment, the first portion 33a of each of the nickel silicide films 33 is formed protruding in the openings 51a, 51b of the oxide film 51 by self-alignment, using the oxide film 51 as a mask.

By the second heat treatment, the second portion 33b of each of the nickel silicide films 33 is formed protruding toward the semiconductor substrate 30, from the front surface of the semiconductor substrate 30. The second portion 33b of each of the nickel silicide films 33 is in contact with a portion of the p-type region 13 or the FLR 21 in which the second portion 33b is formed, the portion being at a position deep from the front surface of the semiconductor substrate 30 and having a high impurity concentration. The second portion 33b of each of the nickel silicide films 33 forms a low-resistance ohmic contact with the high impurity concentration in the p-type region 13 or the FLR 21 thereof.

Further, by the second heat treatment, the second portion 33b of each of the nickel silicide films 33 diffuses in the semiconductor substrate 30, in a direction parallel to the front surface of the semiconductor substrate 30. As a result, in the nickel silicide films 33, by the second portion 33b that protrudes so as to bite into the semiconductor substrate 30 (the p-type regions 13 and the FLR 21), the width w12 becomes wider than the first portion 33a sandwiched between the oxide film 51. The second portion 33b of each of the nickel silicide films 33 faces and is in contact with a bottom of the oxide film 51 in the depth direction.

The second heat treatment, for example, is performed at a temperature at least equal to the temperature of the first heat treatment (step S6). In particular, the second heat treatment, for example, is performed at a temperature in a range from about 800 degrees C. to 1000 degrees C., for example, for about 8 minutes to 15 minutes. In the process at step S7, excess metal is removed and therefore, even when the temperature of the second heat treatment at step S8 is increased, reaction between the nickel film and the oxide film 51 does not occur and therefore, the portion of the oxide film 51 left as the field oxide film 15 is not adversely affected. The second heat treatment, similarly to the first heat treatment, may be lamp heating or an atmosphere heat treatment. The second heat treatment, similarly to the first heat treatment, may be performed using an RTA furnace or a vertical furnace.

Figure 15:
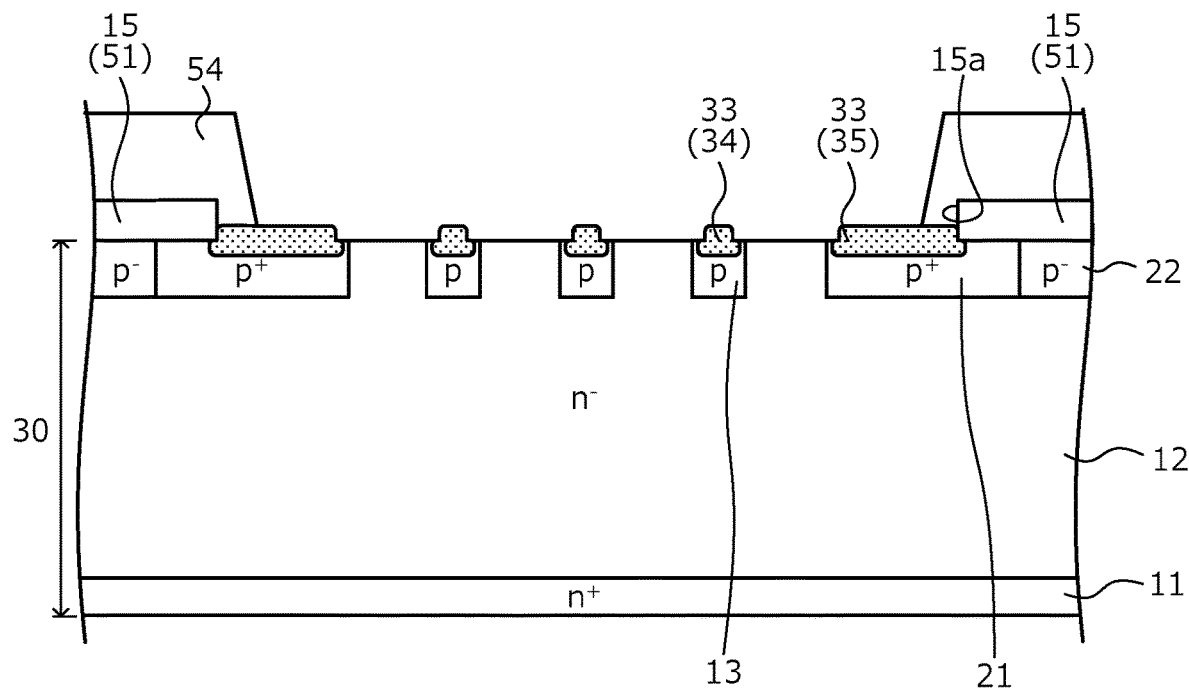
FIG. 15 is a cross-sectional view of a state of the silicon carbide semiconductor device according to the first embodiment during manufacture.

Next, as depicted in FIG. 15, by photolithography, a resist film 54 in which a formation region of the contact hole 15a (refer to FIG. 3) of the field oxide film 15 is opened is formed. The resist film 54 covers only a portion of the oxide film 51 forming the field oxide film 15. Next, etching is performed using the resist film 54 as a mask, whereby the contact hole 15a (refer to FIG. 3) is formed (step S9). In the process at step S9, only the portion of the oxide film 51 forming the field oxide film 15 is left.

In the process at step S9, of the oxide film 51, all of the portions 15' covering the $n^-$-type drift region 12 in the active region 10 are removed and the openings 51a, 51b of the oxide film 51 are all connected, whereby the contact hole 15a already formed in the process at step S4 appears. During the process at step S9, an entire area of the outer peripheral sidewall of the opening 51b of the oxide film 51 is covered completely by the resist film 54 and therefore, the outer peripheral sidewall of the opening 51b of the oxide film 51 (the inner peripheral side surface of the field oxide film 15) is not etched.

In the contact hole 15a, all of the nickel silicide films 33 (the first and the second nickel silicide films 34, 35) and portions of the $n^-$-type drift region 12 in the active region 10 and sandwiched between adjacent nickel silicide films 33 of the nickel silicide films 33 are exposed. In an instance in which the width w12 of the second portion 33b of each of the first nickel silicide films 34 is less than the width w1 of each of the p-type regions 13, portions of the surfaces of the p-type regions 13 not bonded to the first nickel silicide films 34 are further exposed in the contact hole 15a (refer to FIG. 20).

In an instance in which the width w12' of the second portion 33b of the second nickel silicide film 35 in the connecting region 20a of the edge termination region 20 is less than the width w2 of the connecting region 20a of the edge termination region 20, portions of the surface of the FLR 21 not bonded to the second nickel silicide film 35 are further exposed in the contact hole 15a. When the process at step S9 is performed by dry etching, plasma damage of the front surface of the semiconductor substrate 30 due to the dry etching may be left and therefore, the process at step S9 may be preferably performed by wet etching.

The inner peripheral side surface of the field oxide film 15 is covered by the resist film 54 and therefore, dimensional accuracy of the contact hole 15a of the field oxide film 15 is a same as the dimensional accuracy of the opening 51b of the oxide film 51 formed by the dry etching of the process at step S4 and is independent of the dimensional accuracy of the etching in the process at step S9. Therefore, even when the process at step S9 is performed by wet etching, a state in which the second nickel silicide film 35 is in contact with the inner peripheral sidewall of the field oxide film 15 may be maintained.

In this manner, the nickel silicide films 33 may be formed by self-alignment with alignment accuracy using the oxide film 51 as a mask, and the second portion 33b of each of the nickel silicide films 33 is diffused having a width greater than the widths of the openings 51a, 51b of the oxide film 51 and is formed in substantially an entire area of the surface of each of the p-type regions 13 and the surface of the FLR 21. Further, the second nickel silicide film 35 may be disposed so as to be in contact with the field oxide film 15 and therefore, a sufficient ohmic contact area may be ensured in the connecting region 20a of the edge termination region 20.

Figure 16:
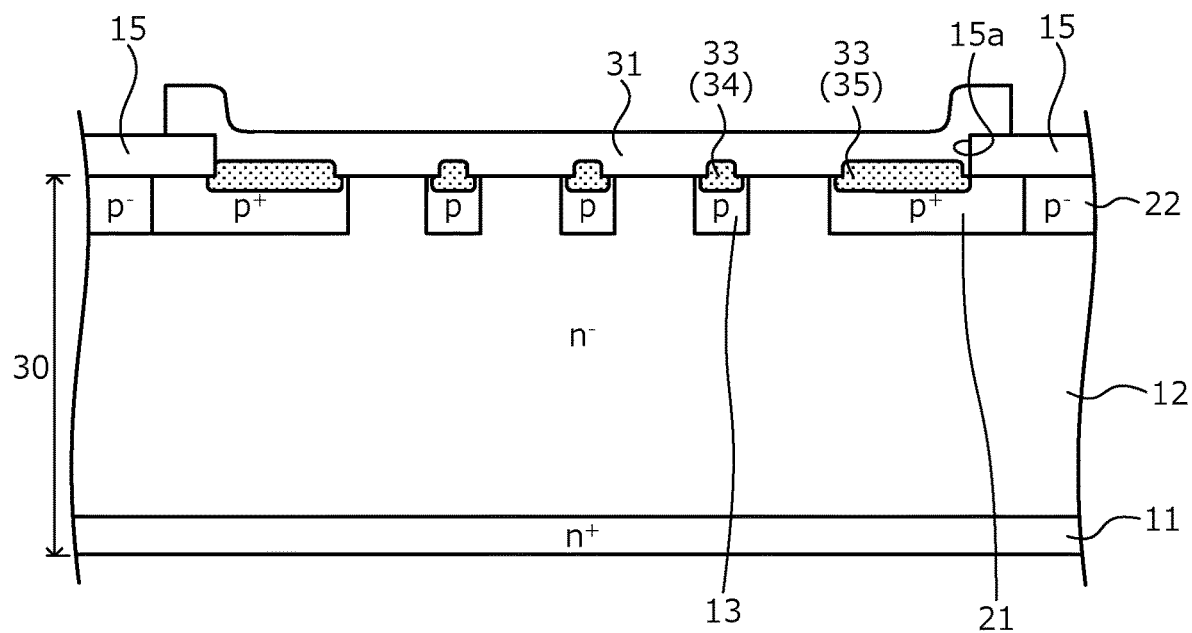
FIG. 16 is a cross-sectional view of a state of the silicon carbide semiconductor device according to the first embodiment during manufacture.

Next, as depicted in FIG. 16, for example, by a physical vapor deposition (PVD) such as sputtering, the titanium film 31 is formed in an entire area of the front surface of the semiconductor substrate 30 in the contact hole 15a, from the surface of the field oxide film 15. Next, by photolithography and etching, the titanium film 31 is left only in the contact hole 15a (step S10). The titanium film 31 may extend onto the field oxide film 15, from inside the contact hole 15a.

Next, for example, the titanium film 31 is sintered by a heat treatment of a temperature of about 500 degrees C. for about 10 minutes. By this heat treatment, a Schottky junction between the titanium film 31 and the $n^-$-type drift region 12 is formed. Next, for example, by a physical vapor deposition such as sputtering, an aluminum alloy film is formed on the surface of the titanium film 31 and the surface of the field oxide film 15. Next, by photolithography and etching, the aluminum alloy film is selectively removed, thereby leaving the aluminum alloy film 32 that becomes the front electrode 14, on the surface of the titanium film 31.

Next, the semiconductor substrate 30 (semiconductor wafer) is ground from the back surface and thinned to a product thickness. Next, for example, by a physical vapor deposition such as sputtering, nickel, titanium, etc. is deposited in an entire area of the back surface of the semiconductor substrate 30 (the back surface of the $n^+$-type starting substrate 11) and thereafter, the back electrode 19 is formed by laser annealing (step S11). Subsequently, after the protective film of the front surface of the semiconductor substrate 30 is removed, the semiconductor substrate 30 is diced (cut) into individual chips, whereby the silicon carbide semiconductor device 40 depicted in FIGS. 1 and 3 is completed.

As described above, according to the first embodiment, the ohmic electrodes in ohmic contact with the semiconductor substrate are formed by self-alignment in the openings of the oxide film used as a mask, in an entire area of the front surface of the semiconductor substrate. Each of the ohmic electrodes, with the front surface of the semiconductor substrate as a border, has a first portion that protrudes from the front surface of the semiconductor substrate in a direction away from the front surface of the semiconductor substrate and a second portion that protrudes into the semiconductor substrate from the front surface of the semiconductor substrate in the depth direction, the second portion having a cross-sectional shape having a width wider than that of the first portion.

The width of the first portion of each of the ohmic electrodes is narrower than the width of the p-type region (p-type region configuring the JBS structure, FLR configuring the MPS structure) that is in contact therewith, the width of the first portion being narrower by the design margin for enhancing the alignment accuracy of the mask used in forming the ohmic electrodes. As a result, the ohmic electrodes may be formed facing a respective p-type region in the depth direction with alignment accuracy. Further, even when the width of the first portion of each of the ohmic electrodes is reduced, by the second portion having a width wider than that of the first portion of each of the ohmic electrodes, the ohmic contact area with the respective p-type region may be sufficiently ensured.

In particular, in the connecting region of the edge termination region, the ohmic contact area of the FLR and the ohmic electrodes may be made significantly larger as compared to the conventional structure. As a result, the ohmic contact area of the p-type regions (the p-type regions configuring the JBS structure, the FLR configuring the MPS structure) and the ohmic electrodes is ensured to be an area necessary for obtaining a predetermined surge current capability; a predetermined Schottky junction area of the $n^-$-type drift region and the Schottky electrode is maintained, enabling a low forward voltage to be maintained and reliability may be enhanced.

Further, according to the first embodiment, the thickness of the second portion of each of the ohmic electrodes may be increased and therefore, the p-type regions (the p-type regions configuring the JBS structure, the FLR configuring the MPS structure) may be formed at a position deep from the front surface of the semiconductor substrate. Therefore, an ion implantation for increasing the impurity concentration of the p-type regions near the front surface of the semiconductor substrate may be omitted and the controllability of the ion implantation for forming the p-type regions increases. As a result, the ion implantation period may be shortened and therefore, the manufacturing process throughput may be enhanced.

Further, according to the first embodiment, the ohmic electrodes are formed by self-alignment using the oxide film mask in which openings having sidewalls that are substantially orthogonal to the front surface of the semiconductor substrate are formed, whereby even when the thickness of the metal material film is made thicker than is conventional, the ohmic electrodes may be formed with favorable alignment accuracy and dimensional accuracy. Further, the thickness of the ohmic electrodes may be increased by an easy method of setting the thickness of the metal material film to be thicker than is conventional and dividing the sintering of the metal material film into two sessions performed at differing temperatures, without any additional equipment in particular.

Figure 21:
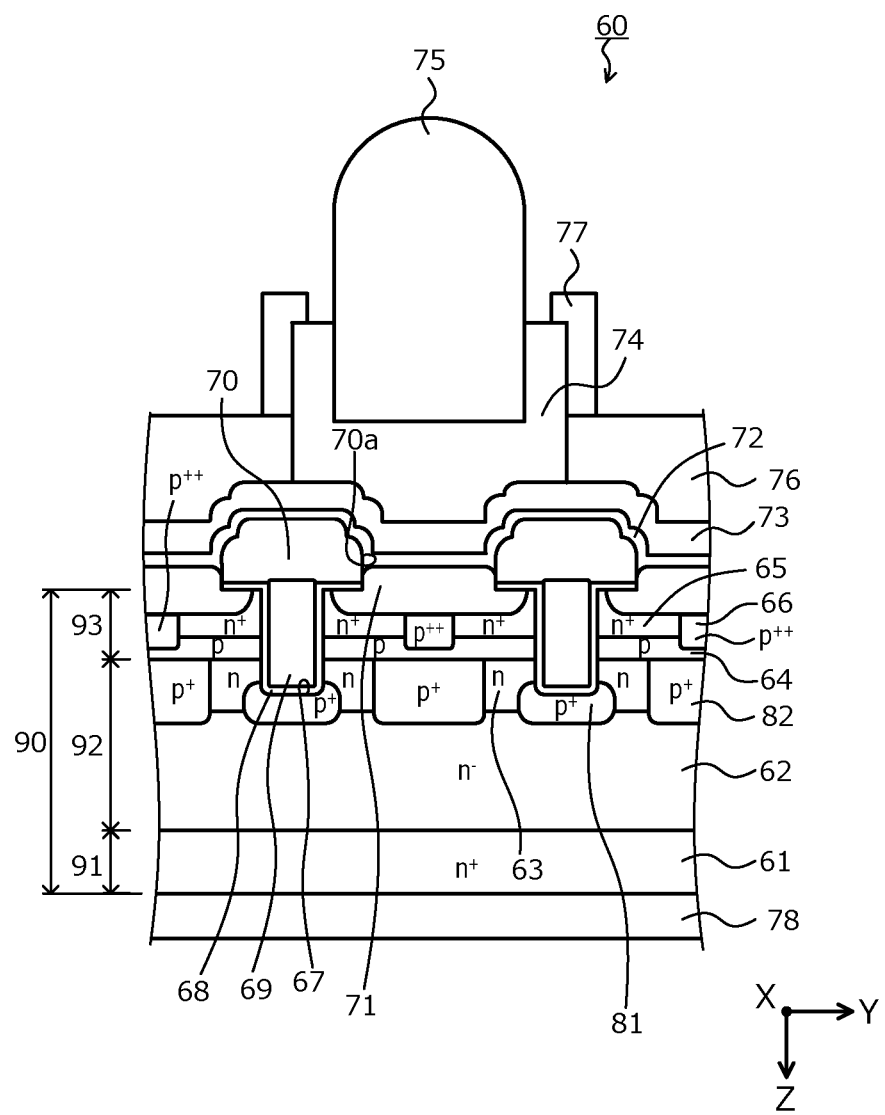
FIG. 21 is a cross-sectional view depicting a structure of a silicon carbide semiconductor device according to a second embodiment.
Figure 22:
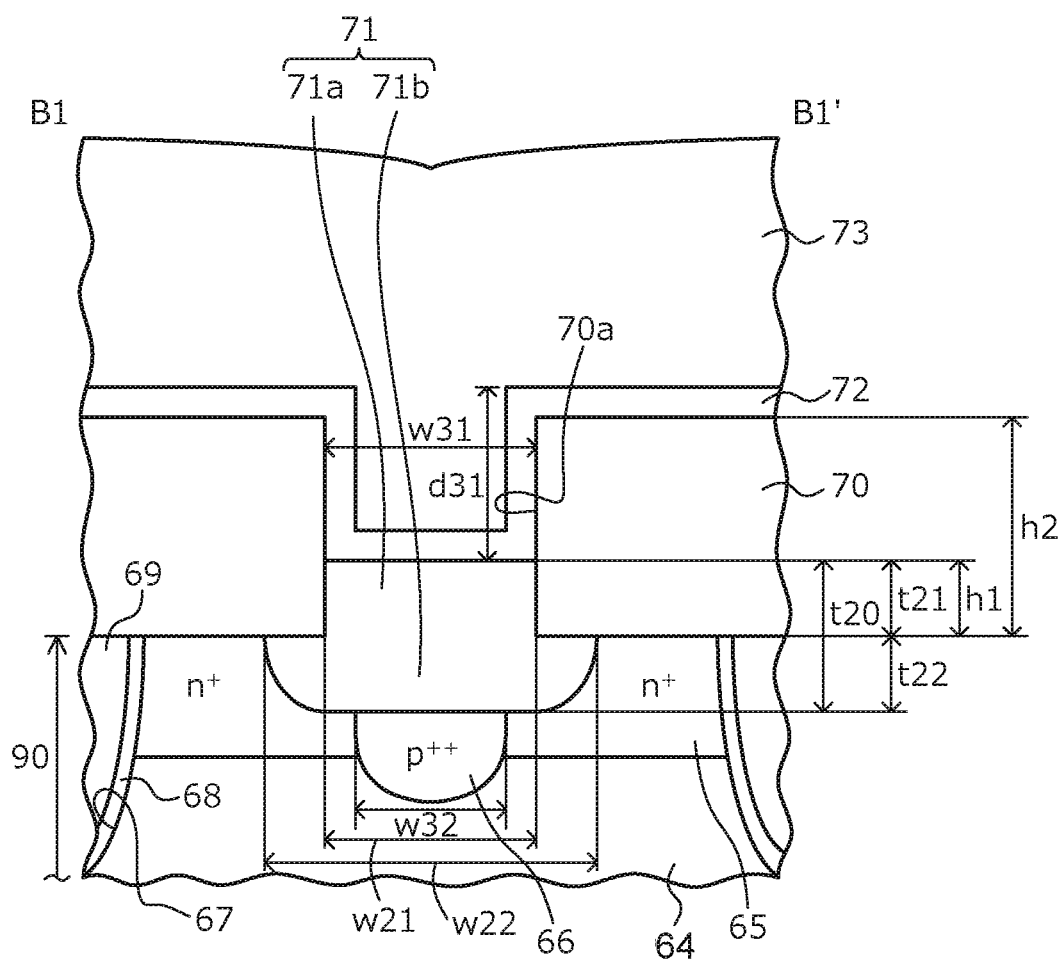
FIG. 22 is an enlarged view of portions of FIG. 21.
Figure 23:
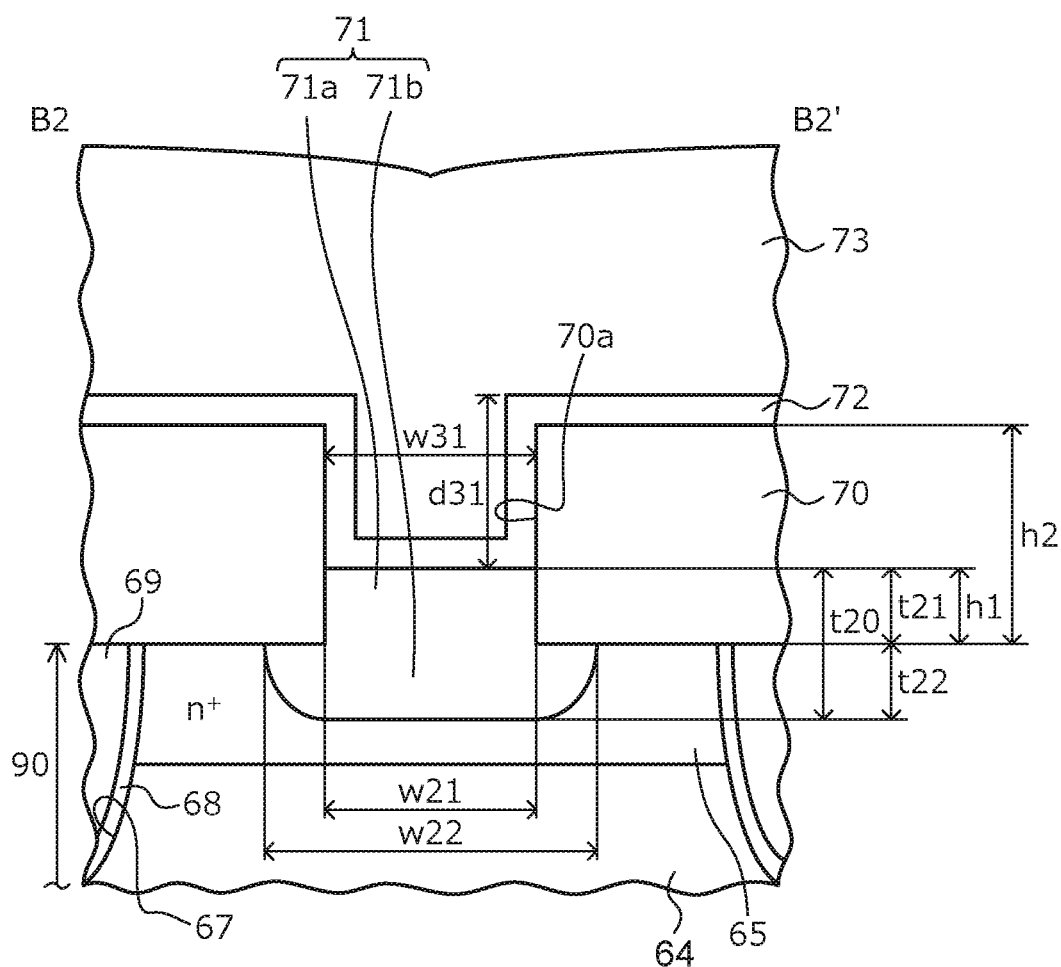
FIG. 23 is an enlarged view of portions of FIG. 21.
Figure 24:
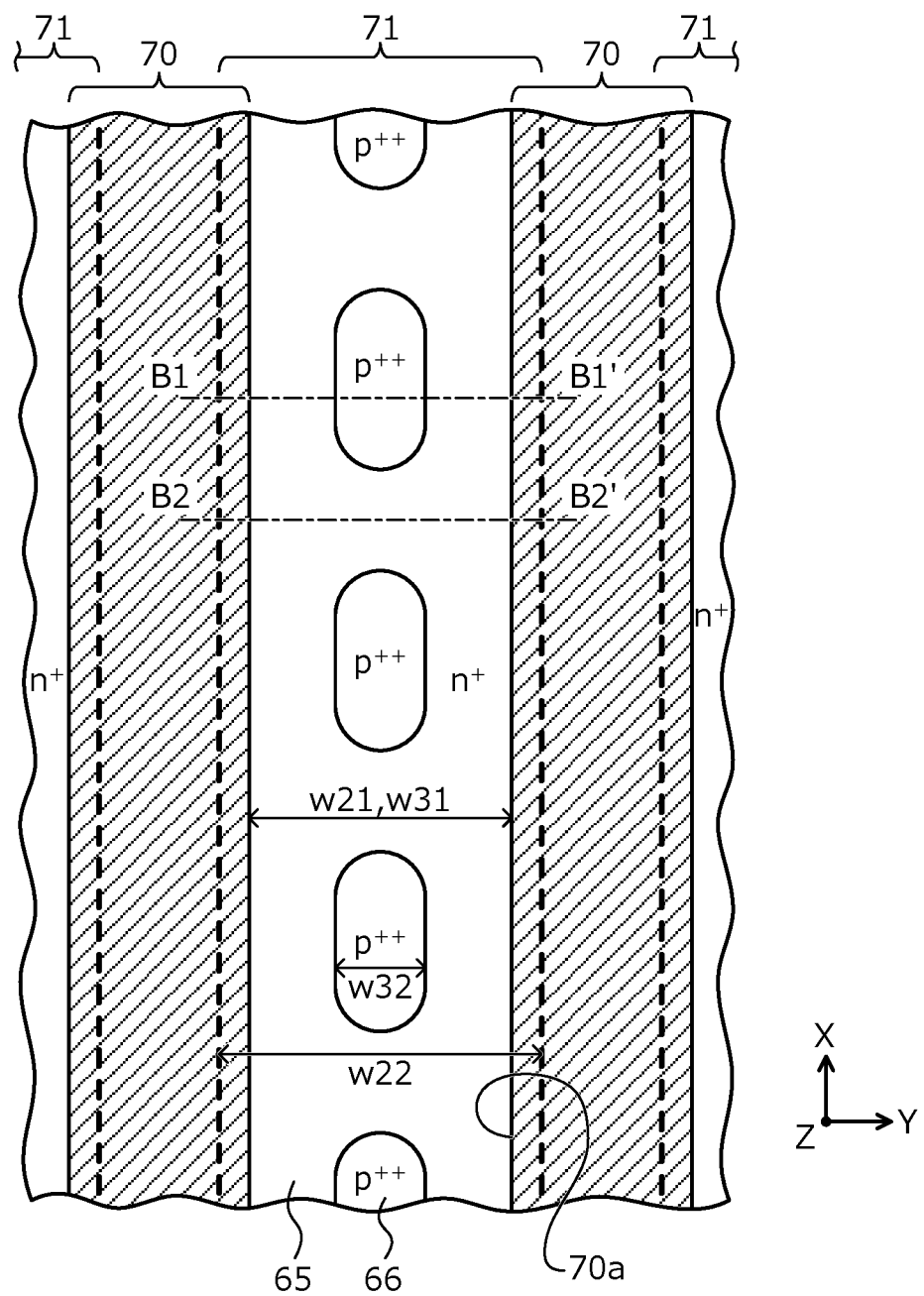
FIG. 24 is a plan view depicting a layout when a portion depicted in FIG. 21 is viewed from the front side of the semiconductor substrate.

Next, a structure of a silicon carbide semiconductor device according to a second embodiment is described. FIG. 21 is a cross-sectional view depicting the structure of the silicon carbide semiconductor device according to the second embodiment. FIGS. 22 and 23 are enlarged views of portions of FIG. 21. FIGS. 22 and 23 are cross-sectional views along cutting line B1-B1' and cutting line B2-B2' in FIG. 24, respectively, and depict different portions of a MOS gate (insulated gate having a three-layered structure including a metal, an oxide film, and a semiconductor) in FIG. 21. FIG. 24 is a plan view depicting a layout when a portion depicted in FIG. 21 is viewed from the front side of the semiconductor substrate.

A silicon carbide semiconductor device 60 according to the second embodiment is a vertical MOSFET having MOS gates with a trench gate structure in which the nickel silicide films 33 of the silicon carbide semiconductor device 40 according to the first embodiment are applied as a front electrode. A unit cell (functional unit of a device element) of the MOSFET has, on a front surface (first main surface) side of a semiconductor substrate (semiconductor chip) 90 containing silicon carbide, one MOS gate configured by a p-type base region (second-conductivity-type region) 64, an $n^+$-type source region (first-conductivity-type high-concentration region) 65, a $p^{++}$-type contact region 66, a trench 67, a gate insulating film 68, and a gate electrode 69.

The semiconductor substrate 90 is an epitaxial substrate in which an $n^-$-type silicon carbide layer 92 constituting an $n^-$-type drift region (first-conductivity-type region) 62 and a p-type silicon carbide layer 93 constituting the p-type base regions 64 are sequentially formed by epitaxial growth on a front surface of an $n^+$-type starting substrate 91 containing silicon carbide. The $n^+$-type starting substrate 91 constitutes an $n^+$-type drain region 61. Of the semiconductor substrate 90, a main surface that is a surface of the p-type silicon carbide layer 93 is assumed to be a front surface and a main surface that is a surface of the $n^+$-type starting substrate 91 (back surface of the $n^+$-type starting substrate 91) is assumed to be a back surface (second main surface). In an active region of the semiconductor substrate 90, multiple unit cells of the MOSFET are disposed.

The trenches 67 penetrate through the p-type silicon carbide layer 93 in the depth direction from the front surface of the semiconductor substrate 90 and reach the $n^-$-type silicon carbide layer 92. The trenches 67 are disposed in a striped pattern extending in a direction parallel to the front surface of the semiconductor substrate 90 (here, a first direction X). In each of the trenches 67, one of the gate electrodes 69 is provided via one of the gate insulating films 68. The gate electrodes 69 extend in the trenches 67, in a linear shape in the direction in which the trenches 67 extend (the first direction X).

Between adjacent trenches 67 of the trenches 67, in surface regions of the front surface of the semiconductor substrate 90, the p-type base regions 64, the $n^+$-type source regions 65, and the $p^{++}$-type contact regions 66 are selectively provided. The $n^+$-type source regions 65 and the $p^{++}$-type contact regions 66, between the front surface of the semiconductor substrate 90 and the p-type base regions 64, are each disposed in contact with the p-type base regions 64. The $n^+$-type source regions 65 and the $p^{++}$-type contact regions 66 are exposed at the front surface of the semiconductor substrate 90.

The $n^+$-type source regions 65 and the $p^{++}$-type contact regions 66 being exposed at the front surface of the semiconductor substrate 90 means that the $n^+$-type source regions 65 and the $p^{++}$-type contact regions 66 are in contact with later-described nickel silicide films 71 in contact holes 70a of a later-described interlayer insulating film 70. The $n^+$-type source regions 65 and the $p^{++}$-type contact regions 66, between adjacent trenches 67 of the trenches 67, are disposed to repeatedly alternate with one another in the first direction X that is the same direction in which the gate electrodes 69 extend (refer to FIG. 24).

The $n^+$-type source regions 65, at sidewalls of the trenches 67, are in contact with the gate insulating films 68; and the $p^{++}$-type contact regions 66 are in contact with the $n^+$-type source regions 65 at positions separate from the trenches 67. Each of the $n^+$-type source regions 65, between adjacent trenches 67 of the trenches 67, has a ladder-like shape surrounding peripheries of the $p^{++}$-type contact regions 66 in a plan view thereof. Therefore, each of the $n^+$-type source regions 65 has portions that extend along the sidewalls of the trenches 67 in the first direction X and portions that are sandwiched between the $p^{++}$-type contact regions 66 that are adjacent to one another in the first direction X.

The $p^{++}$-type contact regions 66 may be omitted. In this instance, instead of the $p^{++}$-type contact regions 66, the p-type base regions 64 reach the front surface of the semiconductor substrate 90 and are exposed, and the $n^+$-type source regions 65 surround peripheries of surface regions of the p-type base regions 64 exposed at the front surface of the semiconductor substrate 90. In the semiconductor substrate 90, between the $n^+$-type drain region 61 (the $n^+$-type starting substrate 91) and the p-type base regions 64, the $n^-$-type drift region 62 is provided in contact with the $n^+$-type drain region 61.

Between the $n^-$-type drift region 62 and the p-type base regions 64, n-type current spreading regions 63 may be provided in contact with the p-type base regions 64 and the $n^-$-type drift region 62. The n-type current spreading regions 63 are a so-called current spreading layer (CSL) that reduces carrier spreading resistance. The n-type current spreading regions 63 may be formed deeper or shallower on a drain side (closer to the $n^+$-type drain region 61) than are later-described first and second $p^+$-type regions 81, 82.

In the semiconductor substrate 90, at positions closer to the $n^+$-type drain region 61 than are bottoms of the trenches 67, the first and the second $p^+$-type regions 81, 82 may each be selectively provided. The first and the second $p^+$-type regions 81, 82 extend in a linear shape in the first direction X in which the trenches 67 extend. The first and the second $p^+$-type regions 81, 82 are disposed to repeatedly alternate with one another in a second direction Y that is orthogonal to the first direction X and parallel to the front surface of the semiconductor substrate 90. The n-type current spreading regions 63 are provided between adjacent first and second p+-type regions 81, 82 of the first and the second p+-type regions 81, 82.

The first and the second p+-type regions 81, 82 have a function of mitigating electric field applied to the bottoms of the trenches 67 in an operation state in which high electric field is applied between the drain and source. The operation state in which high electric field is applied between the drain and source is a state in which high electric field is applied near pn junctions between the p-type base regions 64 and the n-type current spreading regions 63, based on dynamic characteristics (breakdown voltage, reverse bias safe operating area (RBSOA), short-circuit withstand).

The first and the second p+-type regions 81, 82 may terminate in the n-type current spreading regions 63 on the drain side and be surrounded by the n-type current spreading regions 63 (not depicted). The first and the second p+-type regions 81, 82 may terminate on the drain side, at same positions as the n-type current spreading regions 63 and may be in contact with the n−-type drift region 62 (not depicted). Alternatively, the first and the second p+-type regions 81, 82 may extend further on the drain side than do the n-type current spreading regions 63 and may terminate in the n−-type drift region 62 (refer to FIG. 21).

The first p+-type regions 81 are provided separate from the p-type base regions 64, facing the bottoms of the trenches 67 in the depth direction. The first p+-type regions 81 may be exposed at the bottoms of the trenches 67 or may be disposed at positions separate from the bottoms of trenches 67 and further on the drain side than are the bottoms of the trenches 67. The first p+-type regions 81 being exposed at the bottoms of the trenches 67 means that the first p+-type regions 81 are in contact with the gate insulating films 68 at the bottoms of the trenches 67. The second p+-type regions 82, between adjacent trenches 67 of the trenches 67, are provided separate from the first p+-type regions 81 and the trenches 67, and in contact with the p-type base regions 64.

The interlayer insulating film 70 is provided on the front surface of the semiconductor substrate 90, covering the gate electrodes 69. In the contact holes 70a that penetrate through the interlayer insulating film 70 in a depth direction Z, the n+-type source regions 65 and the p++-type contact regions 66 are exposed. A width w31 of the contact holes 70a (width in the second direction Y), for example, is wider than a width w32 of the p++-type contact regions 66 (width in the second direction Y). The nickel silicide films 71 are ohmic electrodes in ohmic contact with the n+-type source regions 65 and the p++-type contact regions 66 in the contact holes 70a.

The nickel silicide films 71 extend in a linear shape in the first direction X in which the trenches 67 extend. The nickel silicide films 71 have a cross-sectional shape similar to a cross-sectional shape of the nickel silicide films 33 of the first embodiment (refer to FIGS. 3 and 4). In other words, each of the nickel silicide films 71, with the front surface of the semiconductor substrate 90 as a border, has a first portion 71a that protrudes from the front surface of the semiconductor substrate 90 in a direction away from the front surface of the semiconductor substrate 90 and a second portion 71b that protrudes toward the p++-type contact regions 66 in the depth direction from the front surface of the semiconductor substrate 90.

The first portion 71a of each of the nickel silicide films 71 protrudes in the contact holes 70a of the interlayer insulating film 70 in a direction away from the front surface of the semiconductor substrate 90. The second portion 71b of each of the nickel silicide films 71 protrudes in the semiconductor substrate 90 from the front surface of the semiconductor substrate 90 and is in contact with the n+-type source regions 65 and the p++-type contact regions 66. In an instance in which the p++-type contact regions 66 are not provided, instead of the p++-type contact regions 66, the p-type base regions 64 are exposed in the contact holes 70a and in contact with the nickel silicide films 71.

A thickness t21 of the first portion 71a and a thickness t22 of the second portion 71b of each of the nickel silicide films 71 are substantially equal to each other. Here, the front surface of the semiconductor substrate 90 is a contact face between the interlayer insulating film 70 (or, insulating layer in which the gate insulating films 68 and the interlayer insulating film 70 are sequentially stacked) and the n+-type source regions 65. Conditions of a thickness t20 of the nickel silicide films 71 are similar to those for the thickness t10 of each of the nickel silicide films 33 of the first embodiment.

The thicker is the thickness t21 of the first portion 71a of each of the nickel silicide films 71, the more a lower portion of each of the contact holes 70a of the interlayer insulating film 70 is embedded with the first portion 71a of each of the nickel silicide films 71 and the shallower a depth d31 of the contact holes 70a becomes. As a result, an aspect ratio of the contact holes 70a of the interlayer insulating film 70 (=the depth d31/the width w31) decreases and therefore, embeddability of a later-described aluminum alloy film (first metal electrode film) 73 with respect to the contact holes 70a may be increased.

A height h1 that the nickel silicide films 71 protrude in the contact holes 70a of the interlayer insulating film 70, from the front surface of the semiconductor substrate 90 in a direction away from the front surface of the semiconductor substrate 90 may be increased by the thickness t21 of the first portion 71a of each of the nickel silicide films 71 (h1=t21). The height h1 that the nickel silicide films 71 protrude in the contact holes 70a of the interlayer insulating film 70 is more than 0.2 times than a thickness h2 of the interlayer insulating film 70 (h1/h2>0.2).

In this manner, the height h1 that the nickel silicide films 71 protrude in the contact holes 70a of the interlayer insulating film 70 increases, whereby the aspect ratio of the contact holes 70a of the interlayer insulating film 70 may be reduced to an extent that the embeddability of the aluminum alloy film 73 increases. The thickness h2 of the interlayer insulating film 70, for example, is about 1 μm. Therefore, the height h1 that the nickel silicide films 71 protrude in the contact holes 70a of the interlayer insulating film 70, for example, may be about 200 nm or more.

The first portion 71a of each of the nickel silicide films 71 is formed by self-alignment in an entire area of the front surface of the semiconductor substrate 90 in openings of an oxide film used as a mask for forming the nickel silicide films 71 (corresponds to the openings 51a of the oxide film 51 in FIG. 17). The oxide film used as a mask when the nickel silicide films 71 are formed is left as the interlayer insulating film 70 and the openings of the oxide film become the contact holes 70a. The first portion 71a of each of the nickel silicide films 71 may be formed in the contact holes 70a of the interlayer insulating film 70 with alignment accuracy.

A width w21 of the first portion 71a of each of the nickel silicide films 71 (width in the second direction Y) is a same as the width w31 of the contact holes 70a of the interlayer insulating film 70. The first portion 71a of each of the nickel silicide films 71 is formed in an entire area of the front surface of the semiconductor substrate 90 in the contact holes 70a of the interlayer insulating film 70. An entire periphery of the first portion 71a of each of the nickel silicide films 71 is in contact with sidewalls of the contact holes 70a (side surface of the interlayer insulating film 70).

A width w22 of the second portion 71b of each of the nickel silicide films 71 (width in the second direction Y), similarly to the first embodiment, is wider than the width w21 of the first portion 71a of each of the nickel silicide films 71 and wider than the opening width (the width w31 of the contact holes 70a of the interlayer insulating film 70) of the mask for forming the nickel silicide films 71. Therefore, even when the width w31 of the contact holes 70a of the interlayer insulating film 70 is narrow, contact area (ohmic contact area) of the nickel silicide films 71 and the semiconductor substrate 90 may be increased.

The second portion 71b of each of the nickel silicide films 71 extends toward the gate electrodes 69 so that the width w22 becomes wider than the contact hole 70a in which the second portion 71b is formed; the second portion 71b of each of the nickel silicide films 71 faces and is in contact with the interlayer insulating film 70 in the depth direction. As a result, during formation of the nickel silicide films 71, even when excess carbon precipitates between the nickel silicide films 71 and the $n^+$-type source regions 65, the nickel silicide films 71 adhere to and become stuck to the interlayer insulating film 70 more at an uppermost surface of the chip than at an interface between the nickel silicide films 71 and the $n^+$-type source regions 65 and therefore, the nickel silicide films 71 is resistant to peeling.

In an entire area of the surface of the interlayer insulating film 70 and the surface of the nickel silicide films 71, a barrier metal 72 may be provided along the surface of the interlayer insulating film 70 and the surfaces of the nickel silicide films 71. The barrier metal 72 has a function of preventing mutual reaction between metal films of the barrier metal 72 or between regions facing each other across the barrier metal 72. The barrier metal 72, for example, may have a stacked structure in which a first titanium nitride (TiN) film, a first titanium (Ti) film, a second TiN film, and a second Ti film are sequentially stacked (not depicted).

In the contact holes 70a of the interlayer insulating film 70, the aluminum alloy film 73 is provided in an entire area of the surface of the barrier metal 72 so as to be embedded in the barrier metal 72. The aluminum alloy film 73 connected electrically to the $n^+$-type source regions 65 and the $p^{++}$-type contact regions 66, via the barrier metal 72 and the nickel silicide films 71. The aluminum alloy film 73, the barrier metal 72, and the nickel silicide films 71 are a front electrode functioning as a source electrode.

In an instance in which the barrier metal 72 is not provided, the aluminum alloy film 73 is provided in an entire area of the surface of the interlayer insulating film 70 so as to be embedded in the contact holes 70a of the interlayer insulating film 70. The aluminum alloy film 73, in the contact holes 70a of the interlayer insulating film 70, is in contact with the nickel silicide films 71 and via the nickel silicide films 71 is connected electrically to the $n^+$-type source regions 65 and the $p^{++}$-type contact regions 66. The aluminum alloy film 73 and the nickel silicide films 71 function as a source electrode.

As described above, the first portion 71a of each of the nickel silicide films 71 thickly protrudes in the contact holes 70a of the interlayer insulating film 70, whereby the aspect ratio of the contact holes 70a of the interlayer insulating film 70 decreases. As a result, embeddability of the aluminum alloy film 73 in the contact holes 70a of the interlayer insulating film 70 increases. In addition, step coverage (surface coverage) of the aluminum alloy film 73 increases and the surface of the aluminum alloy film 73 becomes flat.

On the aluminum alloy film 73, first ends of terminal pins 75 are bonded via a plating film 74 and a solder layer (not depicted). Second ends of the terminal pins 75 are exposed outside a case (not depicted) in which the semiconductor substrate 90 is mounted. The terminal pins 75 are round bar-shaped (cylindrical) wiring members having a predetermined diameter and are external connection terminals that lead potential of the aluminum alloy film 73 to an external destination. The terminal pins 75 are soldered to the plating film 74 in an upright state substantially orthogonal to the front surface of the semiconductor substrate 90.

First and second protective films 76, 77, for example, are polyimide films. The first protective film 76 covers a portion of the surface of the aluminum alloy film 73 excluding the plating film 74. The second protective films 77 cover borders between the plating film 74 and the first protective film 76. Instead of the wiring structure using the terminal pins 75, a wiring structure that uses wires may be adopted. A back electrode (second metal electrode film) 78 in ohmic contact with an entire area of the back surface (the back surface of the $n^+$-type starting substrate 91) of the semiconductor substrate 90 is provided. The back electrode 78 functions as a drain electrode.

In a method of manufacturing the silicon carbide semiconductor device 60 according to the second embodiment, to form the nickel silicide films 71, the processes at steps S3 to S8 of the method of manufacturing the silicon carbide semiconductor device 40 according to the first embodiment (refer to flowchart in FIG. 5) suffice to be performed. In the second embodiment, step S1 of FIG. 5 is a process of forming diffused regions such as the $n^+$-type source regions 65, the $p^{++}$-type contact regions 66, the n-type current spreading regions 63, and the first and the second $p^+$-type regions 81, 82; step S2 is a heat treatment for activating these diffused regions. In the second embodiment, steps S9 and S10 in FIG. 5 are not performed.

In particular, in the second embodiment, after the MOS gates are formed by a general method (including the processes at steps S1 and S2), the oxide film (corresponds to the oxide film 51 in FIG. 17) opened at portions corresponding to formation regions of the nickel silicide films 71 is formed by the processes at steps S3 and S4. This oxide film is left as the interlayer insulating film 70. Next, the processes (metal material film formation, the first sintering, excess metal removal, and the second sintering) at steps S5 to S8 are performed sequentially, thereby forming the nickel silicide films 71 (corresponds to FIGS. 18 and 19). Thereafter, the process at step S11 and subsequent processes are performed, whereby the MOSFET in FIG. 21 is completed.

As described above, according to the second embodiment, the width of the ohmic electrodes (nickel silicide film) in ohmic contact with the semiconductor substrate in the contact holes of the interlayer insulating film may be wider than the width of the contact holes of the interlayer insulating film. As a result, even when the cell pitch (arrangement interval of unit cells) of the MOSFET is narrow and the width of the contact holes of the interlayer insulating film is narrow, similarly to the first embodiment, the ohmic contact area of the ohmic electrodes and the semiconductor substrate may be ensured to be sufficiently large.

Further, according to the second embodiment, the thickness of the ohmic electrodes is thicker than is conventional and therefore, the thickness of the first portion of each of the ohmic electrodes protruding in the contact hole of the interlayer insulating film from the front surface of the semiconductor substrate may be increased. As a result, the aspect ratio of the contact holes of the interlayer insulating film may be reduced and the embeddability and flatness of the surface metal electrode (aluminum alloy film) may be enhanced. Therefore, the reliability of the MOSFET may be enhanced.

Further, according to the second embodiment, the ohmic electrodes may be formed by self-alignment in the contact holes of the interlayer insulating film in an entire area of the front surface of the semiconductor substrate without any additional equipment in particular by merely increasing the thickness of the metal material film of the ohmic electrodes to be thicker than is conventional, using the interlayer insulating film as a mask and dividing the sintering of the metal material film into two sessions performed at differing temperatures. Further, the first portion of each of the ohmic electrodes protruding in the contact holes may be thicker than is conventional and by an easy method, embeddability of the surface metal electrodes in the contact holes may be improved.

Figure 25:
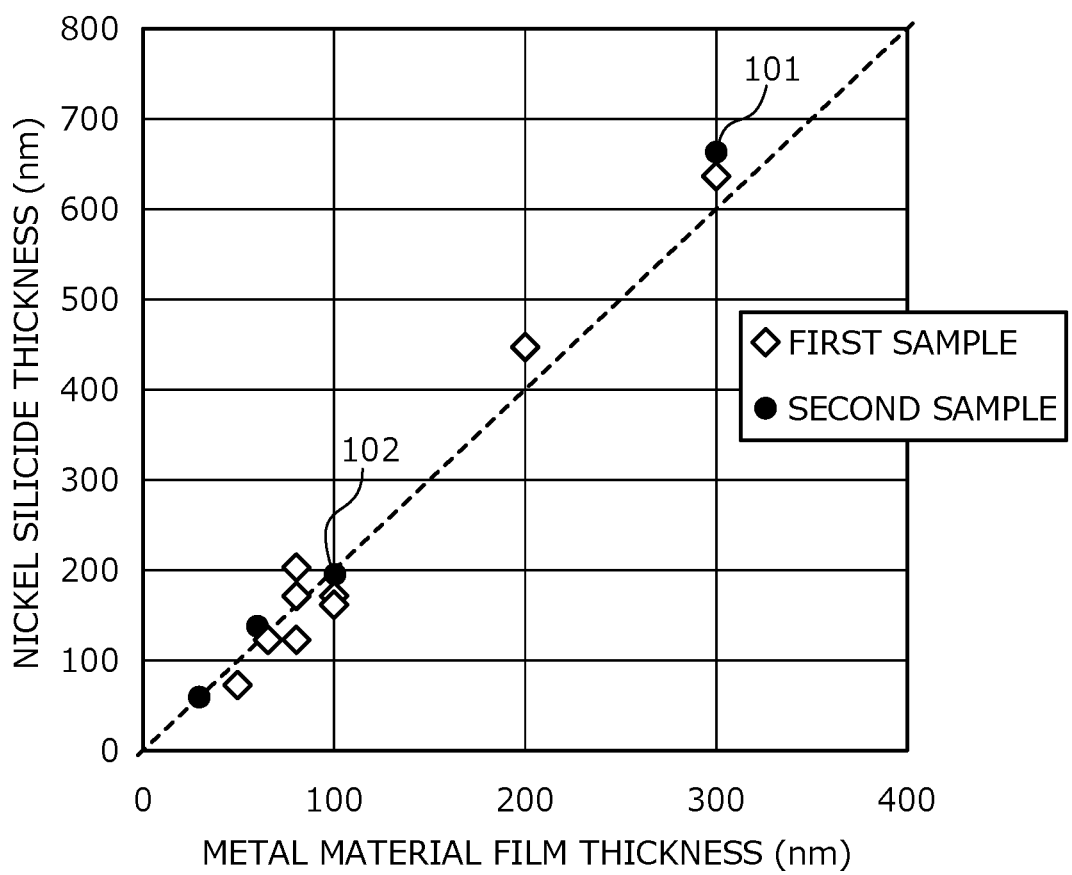
FIG. 25 is a characteristics diagram depicting a relationship between thickness of ohmic electrodes and metal material film thickness of the ohmic electrodes of an experimental example.
Figure 26:
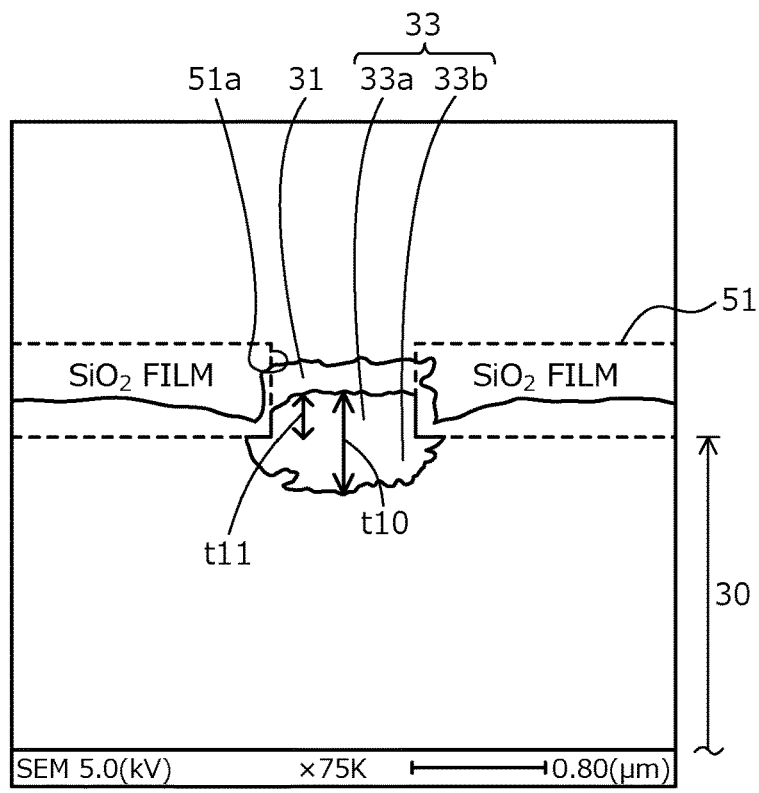
FIG. 26 is a cross-sectional view schematically depicting observed states of ohmic electrodes of an experimental example.
Figure 27:
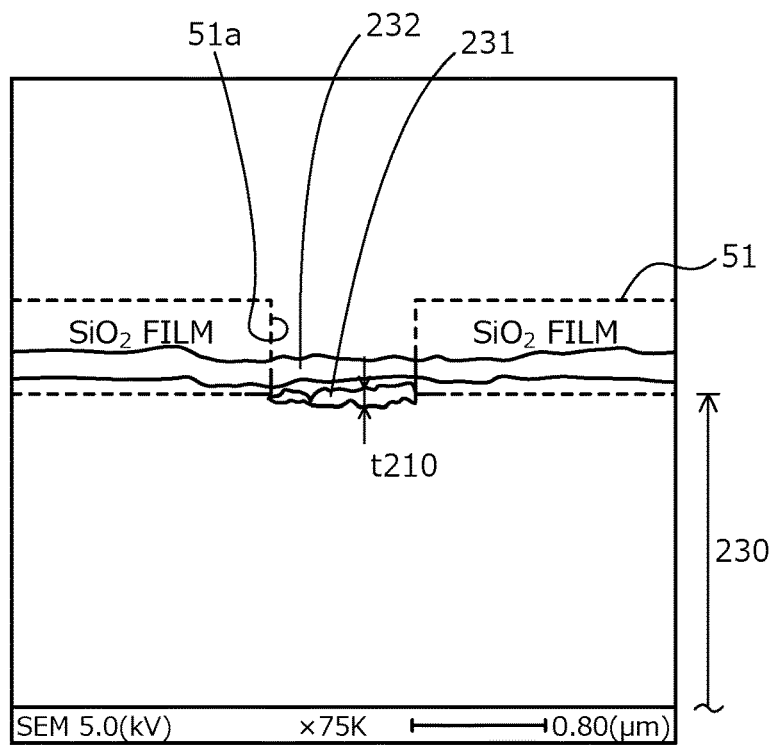
FIG. 27 is a cross-sectional view schematically depicting observed states of ohmic electrodes of an experimental example.

The thickness t10 of the nickel silicide films 33 of the silicon carbide semiconductor device 40 according to the first embodiment described above was verified (refer to FIGS. 17 to 19). FIG. 25 is a characteristics diagram depicting a relationship between thickness of ohmic electrodes and metal material film thickness of the ohmic electrodes of an experimental example. FIGS. 26 and 27 are cross-sectional views schematically depicting observed states of the ohmic electrodes of the experimental example. In FIGS. 26 and 27, the oxide film 51 used as a mask for forming each of ohmic electrodes (nickel silicide films 33, 231) is indicated by a dashed line.

Measurements of the thickness of the nickel silicide films formed by variously changing the thickness of the metal material film are shown in FIG. 25. In FIG. 25, a first sample in which the metal material film of the nickel silicide film is a single-layer nickel film and a second sample in which the metal material film is a metal stacked film in which a first nickel film, an aluminum film, and a second nickel film having thicknesses of a ratio of 1:1:1 are sequentially stacked are shown. In the first sample, the metal material film that is patterned and left in formation regions of the nickel silicide film were sintered by a single heat treatment of a temperature of 800 degrees C. using an RTA furnace under an argon (Ar) atmosphere.

In the second sample, the processes at steps S3 to S8 were performed according to the method of manufacturing the silicon carbide semiconductor device 40 according to the first embodiment described above (refer to the flowchart in FIG. 5). In the first heat treatment at step S6, the metal material film 52 was sintered for 10 minutes using the oxide film 51 as a mask under an argon atmosphere heated to a temperature of 600 degrees C., thereby forming the initial nickel silicide film 53 (refer to FIGS. 11 and 12). In the second heat treatment at step S8, the initial nickel silicide film was sintered for 10 minutes using the oxide film as a mask under an argon atmosphere heated to a temperature of 975 degrees C., thereby achieving the final thickness t10 (refer to FIG. 19).

From the results shown in FIG. 25, in both the first and the second samples, it was confirmed that the thicker was the metal material film, the greater the thickness of the nickel silicide film (ohmic electrodes) could be increased in proportion to the thickness of the metal material film. By setting the thickness of the metal material film to be at least 150 nm, the thickness of the nickel silicide film may be 300 nm. States of the nickel silicide films 33, 231 of samples 101 and 102 in FIG. 25 observed by a scanning electron microscope (SEM) are depicted in FIGS. 26 and 27.

Both of the samples 101, 102 in FIGS. 26 and 27 are the second sample and only the thickness of the metal material film 52 differs. Like the sample 102 depicted in FIG. 27, it was confirmed that when the thickness of the metal material film 52 is thin, the nickel silicide film 231 having a thin thickness t210 and a width that is a same as the width of the openings 51a of the oxide film 51 is formed. On the other hand, like the sample 101 depicted in FIG. 26, by increasing the thickness of the metal material film 52, the nickel silicide films 33 having the thick thickness t10 are formed by self-alignment using the oxide film 51 as a mask, and the first portion 33a of the nickel silicide film 33 protrudes in the opening 51a of the oxide film 51 by the thick thickness t11. Further, an envelope connecting boundaries of the second portion 33b of the nickel silicide film 33 and the semiconductor substrate 30 has a curved shape formed by only slopes of a shape protruding toward the back surface. Further, the length of a portion of the second portion 33b of the nickel silicide film 33 in contact with the opening 51a and exposed at the surface of the semiconductor substrate 30 is shorter than the thickness of the second portion 33b (=t10−t11).

It was confirmed that in the sample 101, each of the nickel silicide films 33, with the front surface of the semiconductor substrate 30 as a border, has the first portion 33a that protrudes from the front surface of the semiconductor substrate 30 in a direction away from the front surface of the semiconductor substrate 30 and the second portion 33b that protrudes in the semiconductor substrate 30 from the front surface of the semiconductor substrate 30 in the depth direction, and at the second portion 33b, the cross-sectional shape has the width w12 that is wider than the width of the first portion 33a. The sample 101 corresponds to the silicon carbide semiconductor device 40 according to the first embodiment described above (refer to FIGS. 3 and 4).

Further, it was confirmed that an initial nickel-silicon film having a thin thickness is formed by the first heat treatment at step S6, excess metal (unreacted portion of the metal material film not converted into a silicide) is removed by the process at step S7 and thereafter, conversion of the nickel-silicon film into a silicide is progressed by the second heat treatment at step S8, whereby no reaction between the metal material film and the oxide film 51 occurs. Therefore, the oxide film 51 used as a mask to form the nickel silicide films 33 may be left as the field oxide film 15 (refer to FIG. 3) and the interlayer insulating film 70 (refer to FIG. 21).

Further, while not depicted, in the first sample, before the metal material film is sintered, the metal material film deposited in an entire area of the surface of the semiconductor substrate is patterned to leave only the metal material film in the formation regions of the nickel silicide film. It was confirmed that the thicker is the thickness of the metal material film, side surfaces of the metal material film are sloped with respect to the front surface of the semiconductor substrate (side etching) during patterning and the metal material film has a trapezoidal cross-sectional shape having a width that progressively narrows with increasing distance from the front surface of the semiconductor substrate and therefore, alignment accuracy and dimensional accuracy of the nickel silicide film degrades.

On the other hand, as depicted in FIG. 26, in the second sample, the nickel silicide films 33 are formed by self-alignment using, as a mask, the oxide film 51 in which the openings 51a having sidewalls that are substantially orthogonal to the front surface of the semiconductor substrate are formed. Therefore, it was confirmed that even when the thickness of the metal material film 52 is increased, the first portions 33a of the nickel silicide films 33 formed in the openings 51a of the oxide film 51 each has a cross-sectional shape corresponding to the shape of the openings 51a of the oxide film 51, and the nickel silicide films 33 may be formed with alignment accuracy and dimensional accuracy.

In the foregoing, the present invention is not limited to the embodiments described above; various modifications within a range not departing from the spirit of the invention are possible; and application to silicon carbide semiconductor devices having ohmic electrodes in ohmic contact with p-type regions disposed in a predetermined pattern is possible. In particular, for example, the present invention is useful for silicon carbide semiconductor devices having a structure for reducing contact resistance between p-type regions (or $p^+$-type contact regions formed in the p-type regions) and ohmic electrodes, a structure in which ohmic electrodes in ohmic contact with p-type regions and an oxide film are in contact, and the like.

Further, in a MOSFET in which an SBD is built-in on the same semiconductor substrate, the present invention is applicable to, for example, a configuration of the front side of the semiconductor substrate. Further, in a reverse conducting IGBT (RC-IGBT) having a structure in which an IGBT and a freewheeling diode (FWD) connected in anti-parallel to the IGBT are integrated and built into a single semiconductor chip, the present invention is applicable in a portion wherein p-type collector regions of the back side of the semiconductor substrate are formed, and in an entire area of the back surface of the semiconductor substrate in the IGBT.

According to the invention described above, a low-resistance ohmic contact may be formed between the nickel silicide film and high impurity-concentration portion of the second-conductivity-type region, at a deep position from the front surface of the semiconductor substrate. Further, according to the invention described above, the ohmic contact area of the nickel silicide film and the semiconductor substrate may be ensured by the width of the second portion of the nickel silicide film, and the surge current capability may be enhanced. Further, according to the invention described above, by the height that the first portion of the nickel silicide film protrudes in the contact hole, the aspect ratio of the contact hole may be reduced and the embeddability of first metal electrode film in the contact hole may be enhanced.

The silicon carbide semiconductor device according to the present invention achieves an effect in that a silicon carbide semiconductor device of high reliability may be provided.

As described above, the silicon carbide semiconductor device according to the present invention is useful for power semiconductor devices used in power converting equipment, power source devices such as in various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having an active region and a termination region surrounding a periphery of the active region, comprising:
   a semiconductor substrate containing silicon carbide and having a first main surface and a second main surface opposite to each other;
   a first-conductivity-type region provided in the semiconductor substrate;
   a plurality of second-conductivity-type regions selectively provided at the first main surface of the semiconductor substrate in the first-conductivity-type region; and
   a plurality of nickel silicide films provided at the first main surface of the semiconductor substrate, each of the plurality of nickel silicide films facing and in ohmic contact with a respective one of the plurality of second-conductivity-type regions, wherein
   said each of the plurality of nickel silicide films has a first portion protruding from the first main surface of the semiconductor substrate in a direction away from the semiconductor substrate and a second portion protruding in the corresponding one of the plurality of second-conductivity-type regions from the first main surface of the semiconductor substrate in the depth direction, and
   the second portion has a width, in a direction parallel to the first main surface of the semiconductor substrate, that is wider than a width of the first portion in said each of the plurality of nickel silicide film.

2. The silicon carbide semiconductor device according to claim 1, wherein
   a thickness of the each of the plurality of nickel silicide films in the depth direction is in a range from 300 nm to 700 nm.

3. The silicon carbide semiconductor device according to claim 1, further comprising:
   a first metal electrode film forming a Schottky junction with the first-conductivity-type region and provided in an entire area of the first main surface of the semiconductor substrate in the active region, the first metal electrode film covering the plurality of nickel silicide films and facing the first-conductivity-type region in the depth direction; and
   a second metal electrode film provided on the second main surface of the semiconductor substrate.

4. The silicon carbide semiconductor device according to claim 3, further comprising:
   an oxide film provided on the first main surface of the semiconductor substrate in the termination region; and
   a second-conductivity-type high-concentration region provided between the first main surface of the semiconductor substrate and the first-conductivity-type region in an entire area of a connecting region located between the active region and the oxide film, and surrounding the periphery of the active region, the second-conductivity-type high-concentration region having an impurity concentration higher than an impurity concentration of the plurality of second-conductivity-type regions, wherein
   the plurality of nickel silicide films has:
      a plurality of first silicide films in ohmic contact with the plurality of second-conductivity-type regions, and
      a second silicide film in ohmic contact with the second-conductivity-type high-concentration region.

5. The silicon carbide semiconductor device according to claim 1, further comprising:
   a plurality of first-conductivity-type high-concentration regions selectively provided between the first main surface of the semiconductor substrate and the plurality of second-conductivity-type regions, the plurality of first-conductivity-type high-concentration regions each having an impurity concentration higher than an impurity concentration of the first-conductivity-type region;

a plurality of trenches each penetrating through respective ones of the plurality of first-conductivity-type high-concentration regions and the plurality of second-conductivity-type regions, and reaching the first-conductivity-type region;

a plurality of gate electrodes each provided in a respective one of the plurality of trenches, via a gate insulating film;

an interlayer insulating film covering the plurality of gate electrodes and provided on the first main surface of the semiconductor substrate;

a plurality of contact holes each penetrating through the interlayer insulating film in the depth direction and reaching the first main surface of the semiconductor substrate;

a first metal electrode film in contact with the plurality of nickel silicide films in the plurality of contact holes, the first metal electrode film being connected electrically to the plurality of first-conductivity-type high-concentration regions and the plurality of second-conductivity-type regions, via the plurality of nickel silicide films; and a second metal electrode film provided on the second main surface of the semiconductor substrate, wherein the each of the plurality of nickel silicide films, at the first portion thereof protrudes in a corresponding one of the plurality of contact holes and is in contact with the first metal electrode film, and the each of the plurality of nickel silicide films, at the second portion thereof is in ohmic contact with both a corresponding one of the plurality of first-conductivity-type high-concentration regions and a corresponding one of the plurality of second-conductivity-type regions.

6. The silicon carbide semiconductor device according to claim 5, wherein a length of the each of the plurality of nickel silicide films that protrudes in the corresponding one of the plurality of contact holes in the depth direction is more than 0.2 times a thickness of the interlayer insulating film.

7. The silicon carbide semiconductor device according to claim 5, wherein the width of the second portion of the each of the plurality of nickel silicide films is wider than a width of the corresponding one of the plurality of contact holes.

8. The silicon carbide semiconductor device according to claim 1, wherein the plurality of nickel silicide films contains aluminum.

9. The silicon carbide semiconductor device according to claim 1, wherein a boundary between the each of the plurality of nickel silicide films and the corresponding one of plurality of second-conductivity-type regions has a curved shape viewed from a direction parallel to the front surface of the semiconductor substrate, the curved shape corresponding to a slope formed by the first main surface of the semiconductor substrate protruding toward the second main surface of the semiconductor substrate.

* * * * *